US012696461B2

(12) United States Patent
Park

(10) Patent No.: US 12,696,461 B2
(45) Date of Patent: Jul. 28, 2026

(54) INTEGRATED CIRCUIT DEVICE AND ELECTRONIC SYSTEM INCLUDING THE SAME

(71) Applicant: Samsung Electronics Co., Ltd., Suwon-si (KR)

(72) Inventor: Hyunmog Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 493 days.

(21) Appl. No.: 18/467,753

(22) Filed: Sep. 15, 2023

(65) Prior Publication Data

US 2024/0107779 A1     Mar. 28, 2024

(30) Foreign Application Priority Data

Sep. 23, 2022     (KR) ........................ 10-2022-0121134

(51) Int. Cl.
*H10B 63/00*        (2023.01)
*H10B 80/00*        (2026.01)
*H10W 90/00*        (2026.01)

(52) U.S. Cl.
CPC ............. *H10B 63/84* (2023.02); *H10B 63/82* (2023.02); *H10B 80/00* (2023.02); *H10W 90/00* (2026.01); *H10W 90/792* (2026.01)

(58) Field of Classification Search
CPC ........ H10B 63/34; H10B 63/82; H10B 63/84; H10N 70/253; H10N 70/826
See application file for complete search history.

(56) References Cited

U.S. PATENT DOCUMENTS

| | | | |
|---|---|---|---|
| 10,930,353 B1 | 2/2021 | Yoon et al. | |
| 11,133,336 B2 * | 9/2021 | Yakubo | H10B 43/27 |
| 11,165,018 B2 * | 11/2021 | Lee | H10B 63/34 |
| 11,322,544 B2 | 5/2022 | Lee et al. | |
| 11,398,598 B2 * | 7/2022 | Hayakawa | G11C 13/0026 |
| 2013/0009122 A1 | 1/2013 | Park et al. | |
| 2013/0141968 A1 * | 6/2013 | Sasago | H10N 70/231 |
| | | | 365/163 |

(Continued)

FOREIGN PATENT DOCUMENTS

| | | |
|---|---|---|
| KR | 10-2010928 B1 | 10/2019 |
| KR | 10-2020-0142173 A | 12/2020 |

(Continued)

*Primary Examiner* — Mounir S Amer
(74) *Attorney, Agent, or Firm* — Wolf, Greenfield & Sacks, P.C.

(57)     ABSTRACT

An integrated circuit device includes a plurality of conductive lines extending on a semiconductor substrate in a horizontal direction and overlapping each other in a vertical direction, a plurality of insulating layers alternating with the plurality of conductive lines and extending in the horizontal direction, and a channel structure extending through the plurality of conductive lines and the plurality of insulating layers. The channel structure includes a core insulating layer, a resistance change layer on a side wall and a bottom surface of the core insulating layer, a channel layer on an outside wall of the resistance change layer, and a pad pattern on a top surface of the core insulating layer. A topmost surface of the resistance change layer is in contact with the core insulating layer and is spaced apart from a bottommost surface of the pad pattern.

20 Claims, 28 Drawing Sheets

(56)        References Cited

U.S. PATENT DOCUMENTS

2013/0228739 A1 *  9/2013  Sasago ................... H10B 63/20
                                                          257/4
2019/0088318 A1 *  3/2019  Morooka ........... G11C 13/0004
2021/0399017 A1    12/2021 Sun et al.

FOREIGN PATENT DOCUMENTS

KR     10-2021-0014497 A     2/2021
KR     10-2021-0029870 A     3/2021
KR     10-2021-0107304 A     9/2021
WO     WO 2011/074545 A1     6/2011

* cited by examiner

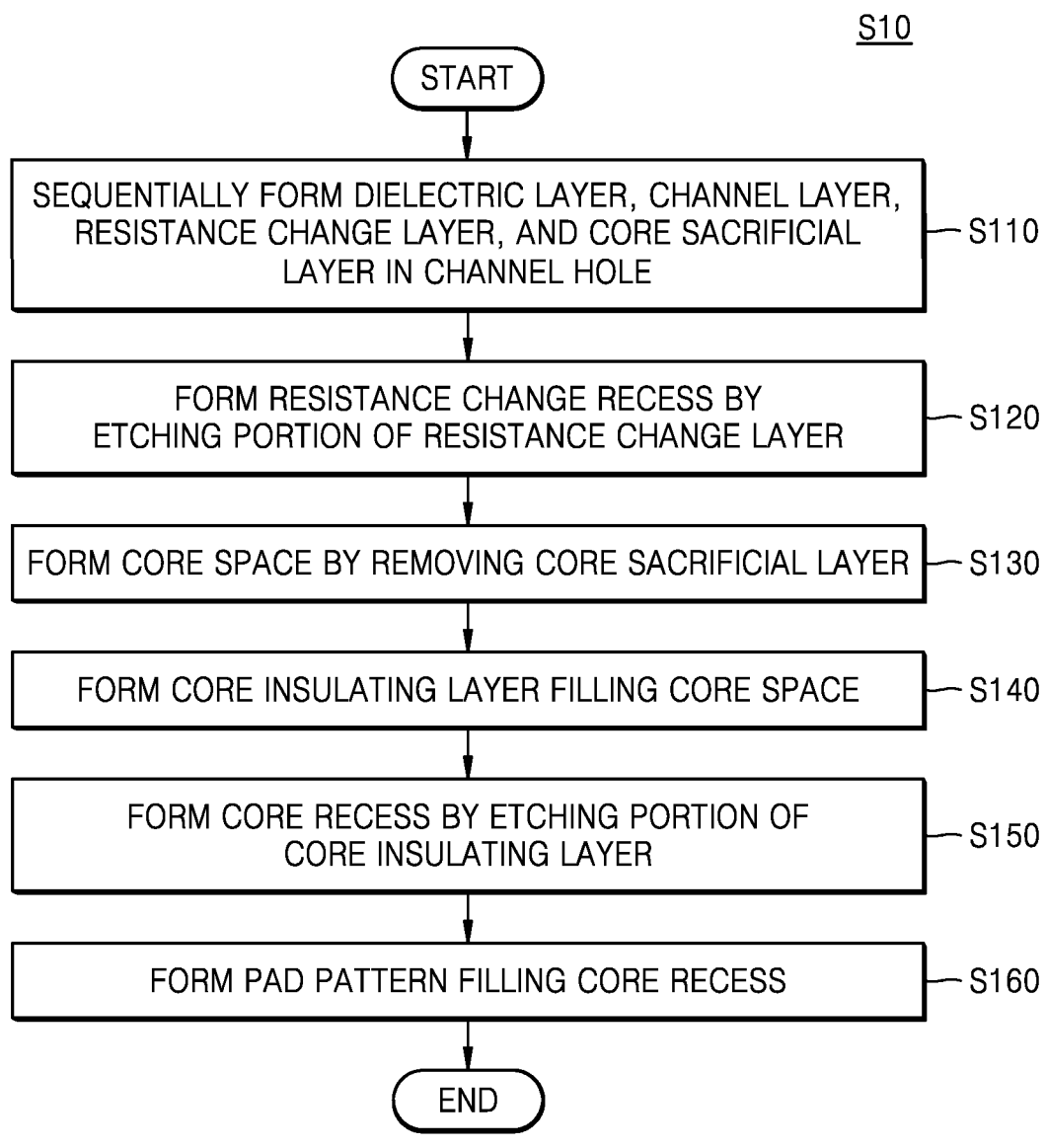

S10

START

SEQUENTIALLY FORM DIELECTRIC LAYER, CHANNEL LAYER, RESISTANCE CHANGE LAYER, AND CORE SACRIFICIAL LAYER IN CHANNEL HOLE — S110

FORM RESISTANCE CHANGE RECESS BY ETCHING PORTION OF RESISTANCE CHANGE LAYER — S120

FORM CORE SPACE BY REMOVING CORE SACRIFICIAL LAYER — S130

FORM CORE INSULATING LAYER FILLING CORE SPACE — S140

FORM CORE RECESS BY ETCHING PORTION OF CORE INSULATING LAYER — S150

FORM PAD PATTERN FILLING CORE RECESS — S160

END

FIG. 12

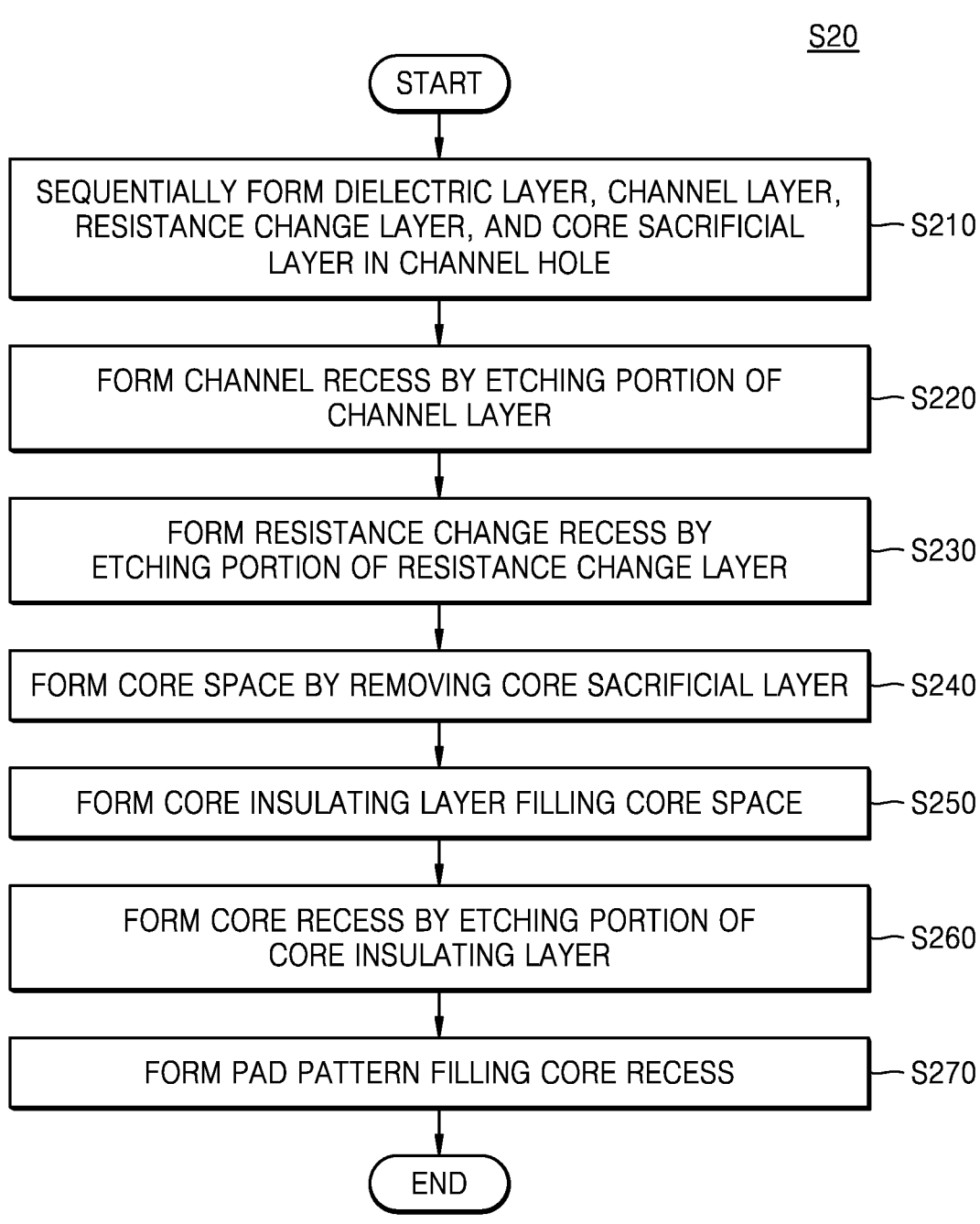

S20

START

↓

SEQUENTIALLY FORM DIELECTRIC LAYER, CHANNEL LAYER, RESISTANCE CHANGE LAYER, AND CORE SACRIFICIAL LAYER IN CHANNEL HOLE — S210

↓

FORM CHANNEL RECESS BY ETCHING PORTION OF CHANNEL LAYER — S220

↓

FORM RESISTANCE CHANGE RECESS BY ETCHING PORTION OF RESISTANCE CHANGE LAYER — S230

↓

FORM CORE SPACE BY REMOVING CORE SACRIFICIAL LAYER — S240

↓

FORM CORE INSULATING LAYER FILLING CORE SPACE — S250

↓

FORM CORE RECESS BY ETCHING PORTION OF CORE INSULATING LAYER — S260

↓

FORM PAD PATTERN FILLING CORE RECESS — S270

↓

END

INTEGRATED CIRCUIT DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0121134, filed on Sep. 23, 2022, in the Korean Intellectual Property Office, the disclosure of which is incorporated by reference herein in its entirety.

BACKGROUND

The inventive concept relates to an integrated circuit device and an electronic system including the same, and more particularly, to an integrated circuit device including a non-volatile vertical memory device and an electronic system including the integrated circuit device.

To meet high performance and economic feasibility, it is desirable to increase the integration density of integrated circuit devices. In particular, the integration density of memory devices is one of important factors in determining the economic feasibility of products. The integration density of two-dimensional (2D) memory devices may be mainly determined by the area of a memory cell unit and thus may be greatly influenced by the level of a micropatterning technique. However, because expensive equipment is used to form micropatterns and the area of a chip die is limited, the integration density of 2D memory devices is still limited, although it is increasing. Therefore, vertical memory devices having a three-dimensional (3D) structure are in demand.

SUMMARY

The inventive concept provides an integrated circuit device having improved memory cell characteristics by widening an upper portion of a channel hole having a high aspect ratio and forming a pad pattern in a vertical memory device having a three-dimensional (3D) structure and an electronic system including the integrated circuit device.

The inventive concept is not limited to what is mentioned above and will be clearly understood by those skilled in the art from the descriptions below.

According to an aspect of the inventive concept, there is provided an integrated circuit device including a plurality of conductive lines extending on a semiconductor substrate in a horizontal direction and overlapping each other in a vertical direction, a plurality of insulating layers alternating with the plurality of conductive lines and extending in the horizontal direction, and a channel structure extending through the plurality of conductive lines and the plurality of insulating layers, wherein the channel structure includes a core insulating layer, a resistance change layer on a side wall and a bottom surface of the core insulating layer, a channel layer on an outside wall of the resistance change layer, and a pad pattern on (e.g., covering) a top surface of the core insulating layer, wherein a topmost surface of the resistance change layer is in contact with the core insulating layer and is spaced apart from a bottommost surface of the pad pattern.

According to another aspect of the inventive concept, there is provided an integrated circuit device including a semiconductor substrate including a cell region and a connection region adjacent to the cell region, a gate stack extending in a first direction and a second direction, including a plurality of conductive lines and a plurality of insulating layers, and having a stepped structure in the connection region, the first and second directions being parallel to a main surface of the semiconductor substrate and crossing each other, the plurality of conductive lines and the plurality of insulating layers being alternately stacked in a third direction that is perpendicular to the main surface of the semiconductor substrate, a channel structure in the cell region and extending through the gate stack in the third direction, and a plurality of contact plugs in the connection region and in contact with respective end portions of the plurality of conductive lines, wherein the channel structure includes a core insulating layer, a resistance change layer on a side wall and a bottom surface of the core insulating layer, a channel layer on an outside wall of the resistance change layer, a dielectric layer on an outside wall of the channel layer, and a pad pattern on (e.g., covering) a top surface of the core insulating layer, and a topmost surface of the resistance change layer is in contact with the core insulating layer and is spaced apart from a bottommost surface of the pad pattern.

According to a further aspect of the inventive concept, there is provided an electronic system including a main board, an integrated circuit device on the main board, and a controller on the main board and electrically connected to the integrated circuit device, wherein the integrated circuit device includes a plurality of conductive lines extending on a semiconductor substrate in a horizontal direction and overlapping each other in a vertical direction, a plurality of insulating layers alternating with the plurality of conductive lines and extending in the horizontal direction, and a channel structure extending through the plurality of conductive lines and the plurality of insulating layers, wherein the channel structure includes a core insulating layer, a resistance change layer on a side wall and a bottom surface of the core insulating layer, a channel layer on an outside wall of the resistance change layer, and a pad pattern on (e.g., covering) a top surface of the core insulating layer, and a topmost surface of the resistance change layer is in contact with the core insulating layer and is spaced apart from a bottommost surface of the pad pattern.

BRIEF DESCRIPTION OF THE DRAWINGS

Embodiments will be more clearly understood from the following detailed description taken in conjunction with the accompanying drawings in which:

FIG. 4 is a cross-sectional view taken along line IV-IV' in FIG. 3;

FIGS. 7 to 9 are cross-sectional views of integrated circuit devices according to some embodiments;

FIG. 10 is a flowchart of a method of manufacturing an integrated circuit device, according to some embodiments;

FIG. 12 is a flowchart of a method of manufacturing an integrated circuit device, according to some embodiments;

FIG. 14 is a diagram of an electronic system including an integrated circuit device, according to some embodiments;

DETAILED DESCRIPTION

Hereinafter, some example embodiments are described in detail with reference to the accompanying drawings.

Figure 1:
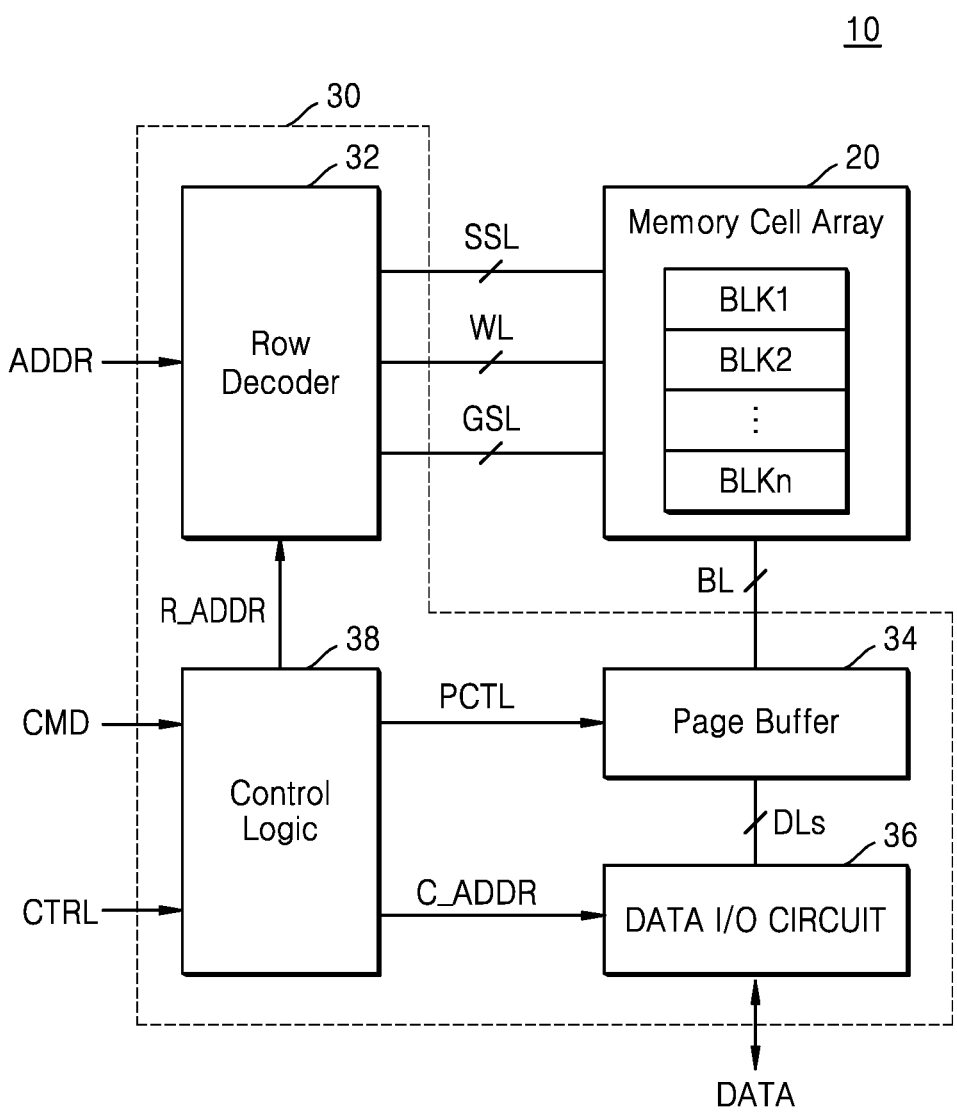
FIG. 1 is a block diagram of an integrated circuit device according to some embodiments.

FIG. 1 is a block diagram of an integrated circuit device according to some embodiments.

Referring to FIG. 1, an integrated circuit device 10 may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through a bit line BL, a word line WL, a string select line SSL, and a ground select line GSL.

The memory cell array 20 may be connected to a page buffer 34 through the bit line BL and to a row decoder 32 through the word line WL, the string select line SSL, and the ground select line GSL. The memory cells included in the memory cell blocks BLK1 to BLKn of the memory cell array 20 may respectively include flash memory cells. The memory cell array 20 may include a three-dimensional (3D) memory cell array. The 3D memory cell array may include a plurality of NAND strings, and each NAND string may include a plurality of memory cells respectively connected to a plurality of word lines WL vertically stacked on a substrate.

The peripheral circuit 30 may include the row decoder 32, the page buffer 34, a data input/output (I/O) circuit 36, and a control logic 38. Although not shown, the peripheral circuit 30 may further include various circuits, such as a voltage generation circuit generating various voltages necessary for the operation of the integrated circuit device 10, an error correction circuit correcting an error in data read from the memory cell array 20, and an I/O interface.

The peripheral circuit 30 may receive an address ADDR, a command CMD, and a control signal CTRL from the outside of the integrated circuit device 10 and may exchange data with a device outside the integrated circuit device 10.

The configuration of the peripheral circuit 30 is described in detail below.

In response to the address ADDR, the row decoder 32 may select at least one of the memory cell blocks BLK1 to BLKn and select the word line WL, the string select line SSL, and the ground select line GSL of the selected memory cell block. The row decoder 32 may transmit, to the word line WL of the selected memory cell block, a voltage for performing a memory operation.

The page buffer 34 may be connected to the memory cell array 20 through the bit line BL. In a program operation, the page buffer 34 may operate as a write driver and apply, to the bit line BL, a voltage corresponding to data to be stored in the memory cell array 20. In a read operation, the page buffer 34 may operate as a sense amplifier and sense data stored in the memory cell array 20. The page buffer 34 may operate according to a control signal PCTL provided from the control logic 38.

The data I/O circuit 36 may be connected to the page buffer 34 through data lines DLs. In a program operation, the data I/O circuit 36 may receive program data from a memory controller (not shown) and provide the program data to the page buffer 34 based on a column address C_ADDR provided from the control logic 38. In a read operation, the data I/O circuit 36 may provide read data stored in the page buffer 34 to the memory controller based on the column address C_ADDR provided from the control logic 38. The data I/O circuit 36 may transmit an address or an instruction to the control logic 38 or the row decoder 32.

The control logic 38 may receive the command CMD and the control signal CTRL from the memory controller. The control logic 38 may provide a row address R_ADDR to the row decoder 32 and a column address C_ADDR to the data I/O circuit 36. The control logic 38 may generate various kinds of internal control signals, which are used in the integrated circuit device 10, in response to the control signal CTRL. For example, the control logic 38 may adjust a voltage level applied to the word line WL and the bit line BL in a memory operation, such as a program operation or an erase operation.

Figure 2:
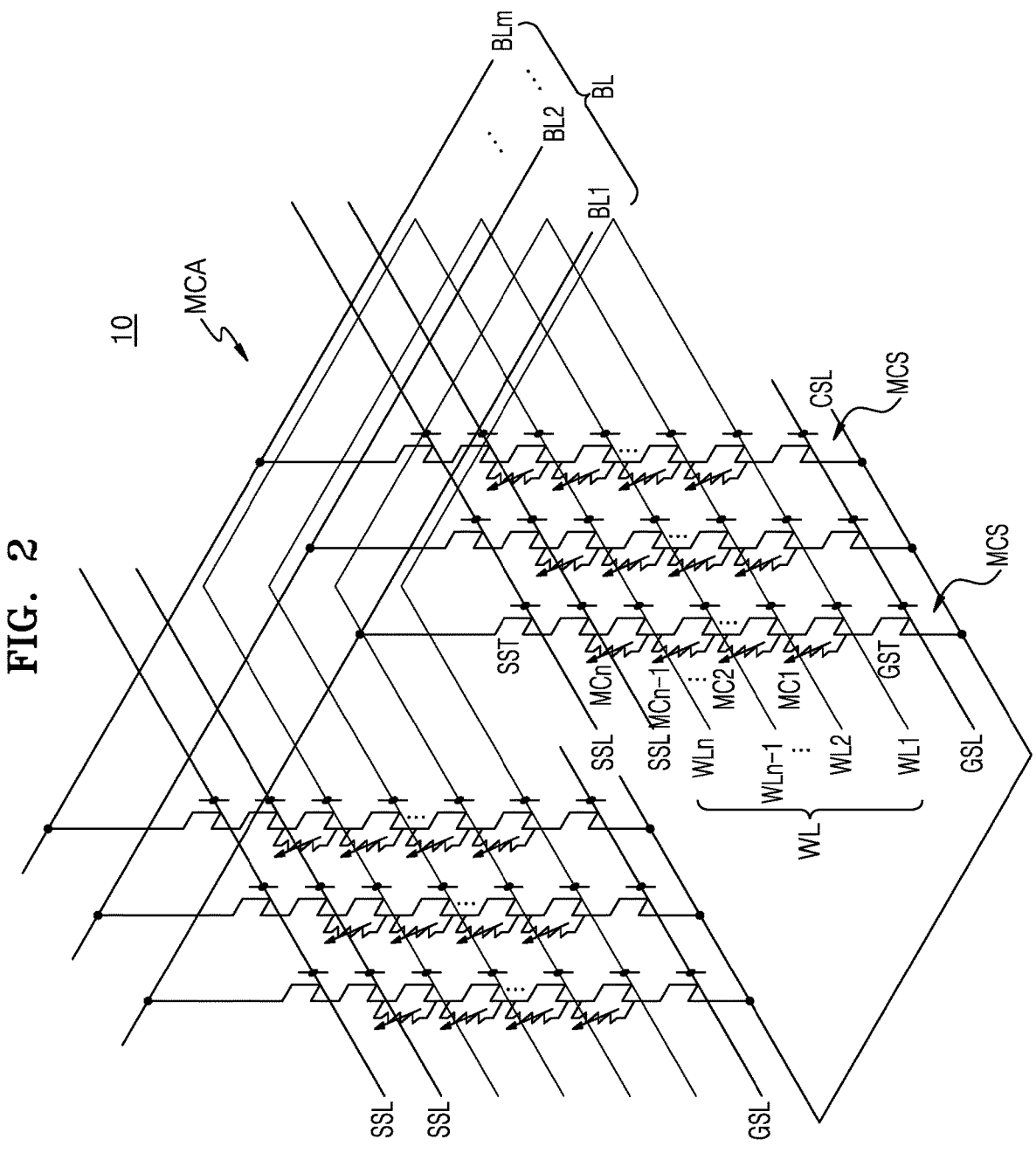
FIG. 2 is an equivalent circuit diagram of a memory cell array of an integrated circuit device according to some embodiments.

FIG. 2 is an equivalent circuit diagram of a memory cell array of an integrated circuit device 10 according to some embodiments.

FIG. 2 illustrates an equivalent circuit of a vertical NAND flash memory device having a vertical channel structure.

In the integrated circuit device 10, a memory cell array MCA may include a plurality of memory cell strings MCS. The memory cell array MCA may include a plurality of bit lines BL or BL1 to BLm, a plurality of word lines WL or WL1 to WLn, at least one string select line SSL, at least one ground select line GSL, a common source line CSL.

The memory cell strings MCS may be between the common source line CSL and the bit lines BL. Although it is illustrated in FIG. 2 that each of the memory cell strings MCS includes two string select lines SSL, the inventive concept is not limited thereto. For example, each of the memory cell strings MCS may include one string select line SSL.

Each of the memory cell strings MCS may include a string select transistor SST, a ground select transistor GST, and a plurality of memory cell transistors MC1 to MCn. A drain region of the string select transistor SST may be connected to its corresponding one among the bit lines BL, and a source region of the ground select transistor GST may be connected to the common source line CSL. Respective source regions of a plurality of ground select transistors GST may be connected in common to the common source line CSL.

The string select transistor SST may be connected to a string select line SSL, and a ground select transistor GST may be connected to the ground select line GSL. The memory cell transistors MC1 to MCn may be respectively connected to the word lines WL.

Each of the memory cell transistors MC1 to MCn may correspond to a circuit including a transistor and a resistor, which are connected in parallel to each other.

Figure 3:
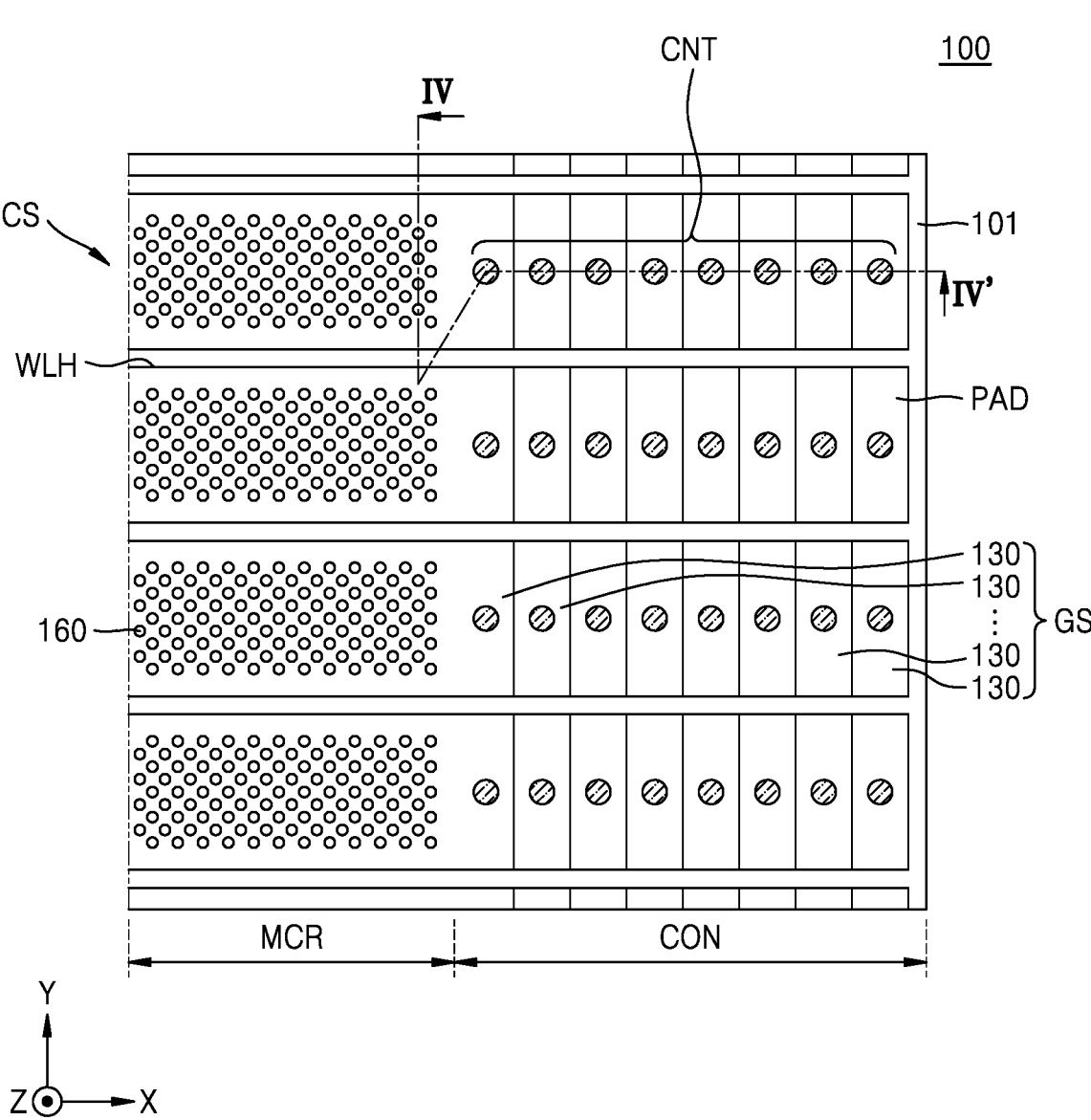
FIG. 3 is a plan view of an integrated circuit device according to some embodiments.
Figure 4:
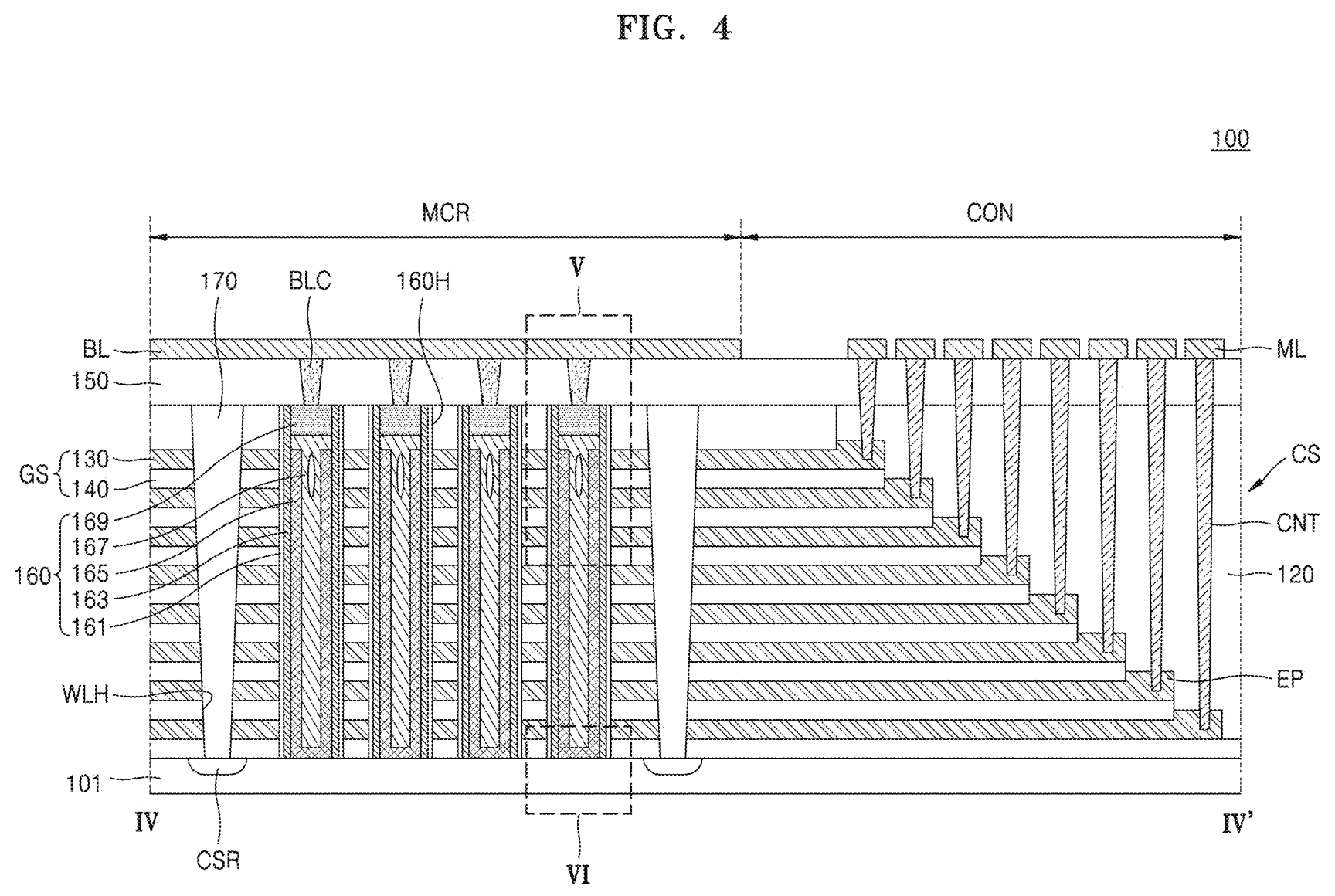
Figure 5:
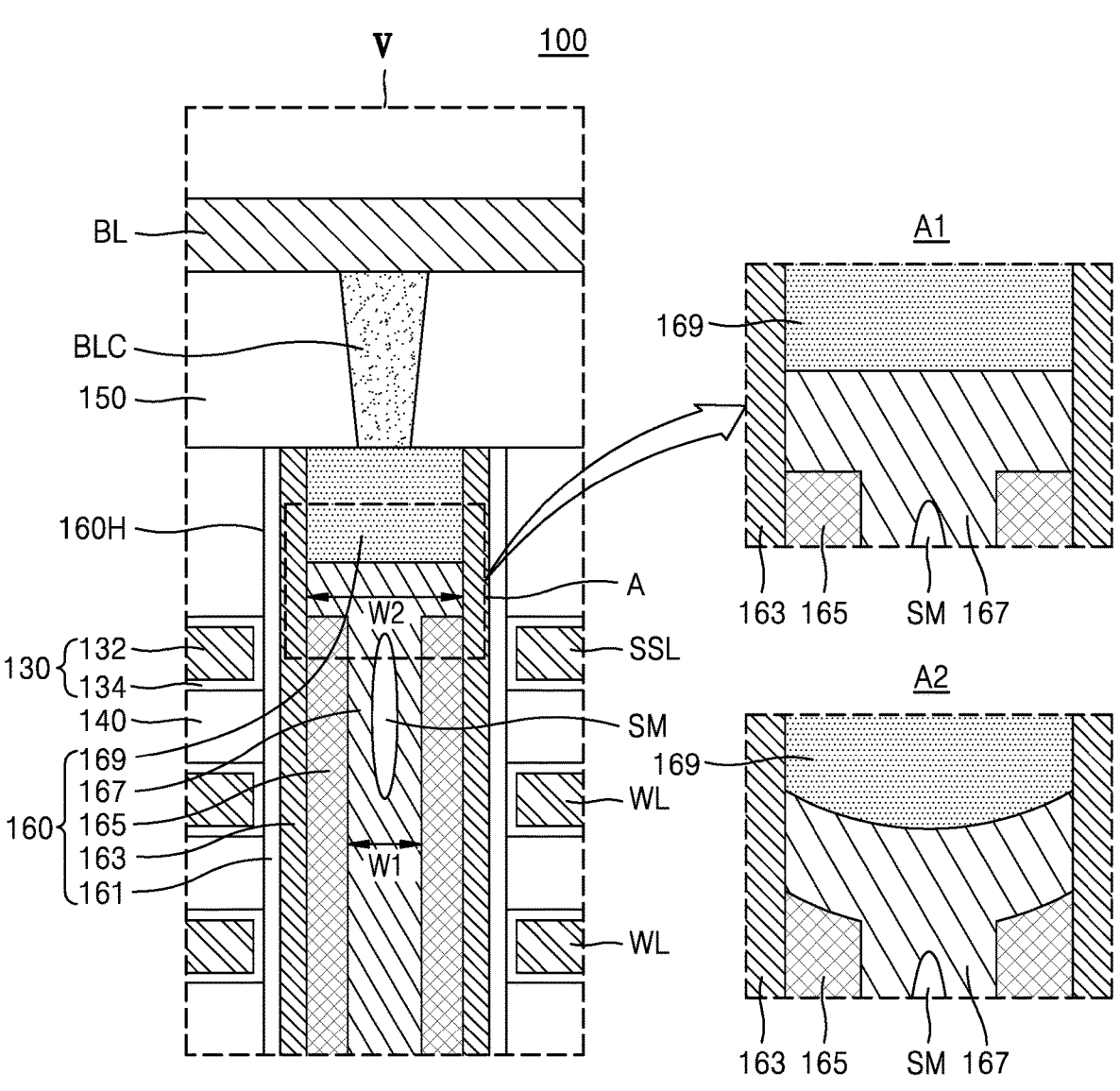
FIG. 5 is an enlarged view of a region V in FIG. 4.
Figure 6:
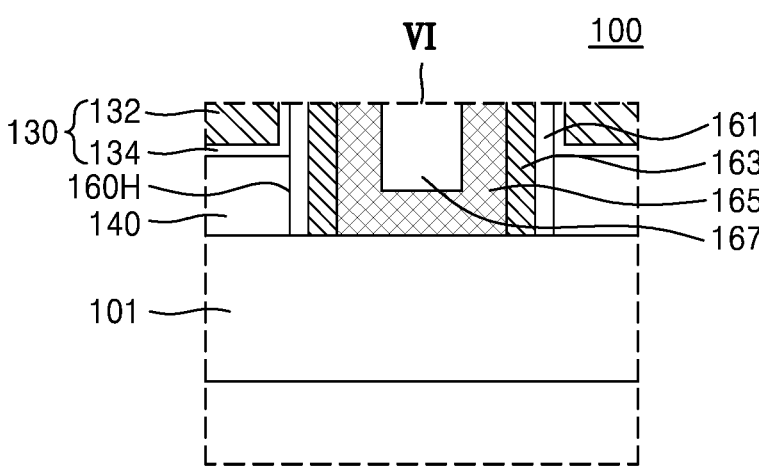
FIG. 6 is an enlarged view of a region VI in FIG. 4.

FIG. 3 is a plan view of an integrated circuit device according to some embodiments, FIG. 4 is a cross-sectional view taken along line IV-IV' in FIG. 3, FIG. 5 is an enlarged view of a region V in FIG. 4, and FIG. 6 is an enlarged view of a region VI in FIG. 4.

Referring to FIGS. 3 to 6, an integrated circuit device 100 may include a cell array structure CS, which includes a memory cell region MCR and a connection region CON.

The vertical channel NAND memory cell array MCA described above with reference to FIG. 2 may be formed in the memory cell region MCR. An elevated end portion EP, which electrically connects the memory cell array MCA in the memory cell region MCR to a peripheral circuit region (not shown), may be arranged in the connection region CON.

A semiconductor substrate 101 may include a semiconductor material, e.g., a Group IV semiconductor, a Group III-V compound semiconductor, or a Group II-VI oxide semiconductor. For example, the Group IV semiconductor may include silicon (Si), germanium (Ge), or SiGe. The semiconductor substrate 101 may be provided as a bulk wafer or a wafer having an epitaxial layer. In some embodiments, the semiconductor substrate 101 may include a silicon-on-insulator (SOI) substrate or a germanium-on-insulator (GeOI) substrate.

A gate stack GS may be on the semiconductor substrate 101 and may extend in a first direction (also referred to as a first horizontal direction, e.g., a X direction in FIG. 3) and a second direction (also referred to as a second horizontal direction, e.g., a Y direction in FIG. 3), which are parallel to the main surface (e.g., a top surface or a bottom surface) of the semiconductor substrate 101. The gate stack GS may include a plurality of conductive lines 130 and a plurality of insulating layers 140. The conductive lines 130 and the insulating layers 140 may alternate with each other in a third direction (also referred to as a vertical direction, e.g., a Z direction in FIG. 3), which is perpendicular to the top surface of the semiconductor substrate 101. An upper insulating layer 150 may be above the gate stack GS. The top surface of the semiconductor substrate 101 may be a surface facing the conductive lines 130, and the bottom surface of the semiconductor substrate 101 may be opposite the top surface thereof. As used herein, "an element A extends in a direction B" (or similar language) may mean that the element A extends longitudinally in the direction B.

Each of the conductive lines 130 may include a buried conductive layer 132 and an insulating liner 134, which extends on (e.g., surrounds) the top, bottom, and side surfaces of the buried conductive layer 132. For example, the buried conductive layer 132 may include metal such as tungsten, metal silicide such as tungsten silicide, doped polysilicon, or a combination thereof. In some embodiments, the insulating liner 134 may include a high-k dielectric material such as aluminum oxide.

The conductive lines 130 may respectively be a ground select line GSL, the word lines WL, and at least one string select line SSL, which form a memory cell string MCS described above with reference to FIG. 2. For example, a lowest conductive line 130 may function as the ground select line GSL, an uppermost conductive line 130 may function as a string select line SSL, and the remaining conductive lines 130 may respectively function as the word lines WL. Accordingly, the memory cell string MCS, in which a ground select transistor GST, a string select transistor SST, and the memory cell transistors MC1 to MCn therebetween are connected in series to one another, may be provided.

A plurality of word line cuts 170 may be respectively in word line cut openings WLH on the semiconductor substrate 101 and may extend in the first direction (the X direction). The word line cuts 170 may include an insulating structure. The gate stack GS between two adjacent word line cuts 170 may form a single block, and the two adjacent word line cuts 170 may define the width of the gate stack GS in the second direction (the Y direction). A plurality of common source regions CSR may be formed in the semiconductor substrate 101. The common source regions CSR may include a region doped with impurities at a high concentration. Each of the word line cuts 170 may have a tapered shape having a horizontal width decreasing from top towards bottom in the third direction (the Z direction).

A plurality of channel structures 160 may extend in the third direction (the Z direction) from the top surface of the semiconductor substrate 101 in the memory cell region MCR and pass through the conductive lines 130. The channel structures 160 may be spaced apart from one another by a certain distance in the first direction (the X direction) and the second direction (the Y direction). The channel structures 160 may be arranged in a zigzag or staggered pattern.

Each of the channel structures 160 may extend in a channel hole 160H, which passes through the gate stack GS. Each of the channel structures 160 may include a dielectric layer 161 on the inside wall of the channel hole 160H, a channel layer 163 on the inside wall of the dielectric layer 161, a resistance change layer 165 on the inside wall of the channel layer 163, a core insulating layer 167 in a central portion of the channel hole 160H, and a pad pattern 169 extending on (e.g., covering) the top surface of the core insulating layer 167.

The channel structures 160 may be in contact with the semiconductor substrate 101. In some embodiments, the resistance change layer 165 may be in contact with the top surface of the semiconductor substrate 101 in a bottom portion of the channel hole 160H. In some embodiments, a contact semiconductor layer (not shown) may be formed to a certain height on the semiconductor substrate 101 in the bottom portion of the channel hole 160H, and the resistance change layer 165 may be electrically connected to the semiconductor substrate 101 through the contact semiconductor layer.

According to the inventive concept, the structural characteristics of the channel structures 160 of the integrated circuit device 100 are described in detail below.

The dielectric layer 161 may completely cover the inside wall of the channel hole 160H. In some embodiments, the topmost surface of the dielectric layer 161 may be at a higher vertical level than the topmost surface of the resistance change layer 165 in the third direction (the Z direction) from the semiconductor substrate 101. In other words, the outside wall of the dielectric layer 161 may be in contact with the conductive lines 130, and the inside wall of the dielectric layer 161 may be in contact with the channel layer 163. For example, the dielectric layer 161 may include at least one selected from the group consisting of silicon oxide, silicon nitride, and silicon oxynitride. In some embodiments, the dielectric layer 161 may include a high-k dielectric material.

The channel layer 163 may completely cover the inside wall of the dielectric layer 161. In some embodiments, the channel layer 163 may have an annular shape in the channel hole 160H but is not limited thereto. The channel layer 163 may include a semiconductor material layer. For example, the channel layer 163 may include an undoped silicon layer, a silicon layer including p- or n-type impurities, or a polysilicon layer including p- or n-type impurities.

The resistance change layer 165 may cover most of the inside wall of the channel layer 163. The resistance change layer 165 may not cover an upper portion of the inside wall of the channel layer 163. The resistance change layer 165 may include a variable resistive material, of which the resistance varies with a voltage applied thereto. The resistance change layer 165 may change from a high resistance state to a low resistance state or from a low resistance state to a high resistance state according to a voltage applied to the word lines WL. Such resistance change may be caused by oxygen vacancies in the resistance change layer 165 or caused by the change in a current conduction mechanism due to trapping/detrapping of electrons in the resistance change layer 165.

The resistance change layer 165 may include a material having hysteresis characteristics. For example, the resistance change layer 165 may include conductive metal oxide or conductive metal nitride. In detail, the resistance change layer 165 may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr). The resistance change layer 165 may include silicon nitride and aluminum nitride.

The core insulating layer 167 may be in the central portion of the channel hole 160H and may fill the channel hole 160H. The core insulating layer 167 may extend in the third direction (the Z direction) and have a side wall, which faces the channel layer 163 and the resistance change layer 165. According to some embodiments, in a region A in FIG. 5, the topmost surface of the core insulating layer 167 may have a flat shape (see A1 in FIG. 5), and the pad pattern 169 may be formed along the flat shape of the core insulating layer 167. According to some embodiments, in the region A in FIG. 5, the topmost surface of the resistance change layer 165 may have an oblique shape and the topmost surface of the core insulating layer 167 may have a round shape that is concave upwards (see A2 in FIG. 5), and the pad pattern 169 (e.g., a lower surface of the pad pattern 169) may be convex downwards along the round shape of the core insulating layer 167. For example, the core insulating layer 167 may include silicon nitride. In some embodiments, the topmost surface of the resistance change layer 165 may be curved and inclined downwardly (i.e., toward the semiconductor substrate 101), and the topmost surface of the core insulating layer 167 and the lower surface of the pad pattern 169 may be curved downwardly as illustrated in A2 in FIG. 5. As used herein, "side wall" may be interchangeable with "sidewall."

A first horizontal width W1 of a first portion of the core insulating layer 167 may be less than a second horizontal width W2 of a second portion of the core insulating layer 167, wherein the side wall of the first portion of the core insulating layer 167 is in contact with the resistance change layer 165, and the side wall of the second portion of the core insulating layer 167 is in contact with the channel layer 163. A seam SM, which is a cavity or an empty space, may be in the first portion of the core insulating layer 167. The topmost surface of the second portion of the core insulating layer 167 may be in contact with the bottommost surface of the pad pattern 169. Accordingly, the seam SM may be spaced apart by a certain distance from the bottommost surface of the pad pattern 169 in the third direction (the Z direction). As used herein, "cavity" may be a gap filled with air (e.g., an air gap), a gap filled with an inert gas (e.g., an inert gas gap), a gap defining a vacuum (e.g., a vacuum gap), etc.

The pad pattern 169 may be on the core insulating layer 167 and fill an upper portion of the channel hole 160H. For example, the pad pattern 169 may include polysilicon including p- or n-type impurities. In some embodiments, the topmost surface of the pad pattern 169 may be at the same vertical level (e.g., substantially at the same vertical level) as the topmost surface of the channel layer 163 from the semiconductor substrate 101. The pad pattern 169 may be in contact with the top surface of the core insulating layer 167 and with a portion of the inside wall of the channel layer 163. Accordingly, the bottommost surface of the pad pattern 169 may be spaced apart from the topmost surface of the resistance change layer 165.

The elevated end portion EP may be at the end of each of the conductive lines 130 in the connection region CON, and a cover insulating layer 120 may be arranged in the connection region CON to cover the elevated end portion EP. The elevated end portion EP of each of the conductive lines 130 may be thicker than the other portion thereof. In other words, the elevated end portion EP of each of the conductive lines 130 may have a higher top surface than the other portion thereof but is not limited thereto.

In the connection region CON, the conductive lines 130 may extend in the first direction (the X direction) and may have a shorter length as a distance from the top surface of the semiconductor substrate 101 in the third direction (the Z direction) increases. In other words, the conductive lines 130 may have a stepped structure in the connection region CON.

In the connection region CON, a contact plug CNT may pass through the cover insulating layer 120 and may be connected to the elevated end portion EP of each of the conductive lines 130. The contact plug CNT may have a tapered pillar shape having a width decreasing from top towards bottom in the third direction (the Z direction).

Although not shown, a plurality of dummy channel structures may extend in the third direction (the Z direction) in the connection region CON and pass through the gate stack GS. The dummy channel structures may be formed to reduce or prevent bending or warping of the gate stack GS during processes of manufacturing the integrated circuit device 100 and provide structural stability.

A bit line contact BLC may pass through the upper insulating layer 150 and may be in contact with the pad pattern 169 of a channel structure 160. A bit line BL may extend on the upper insulating layer 150 in the second direction (the Y direction) and may be in contact with the bit line contact BLC. In the connection region CON, a conductive line ML may be on the upper insulating layer 150. Although not shown, an upper support layer may be between the upper insulating layer 150 and the bit line BL and between the upper insulating layer 150 and the conductive metal line ML.

In general, when the height of the gate stack GS increases, an aspect ratio, i.e., a ratio of the height to the width, of each of the channel hole 160H and the channel structures 160 may also increase. In particular, the aspect ratio of the channel hole 160H may be very high in a structure, in which the gate stack GS includes a plurality of conductive lines 130. In other words, it is very difficult to completely fill the channel hole 160H with the core insulating layer 167 in consideration of process variation or the like.

Accordingly, a cavity or an empty space, i.e., the seam SM, may be formed in the core insulating layer 167. In this case, the pad pattern 169 may fill the seam SM of the core insulating layer 167 so as to form an icicle shape in a process of forming the pad pattern 169 and thus cause an undesirable flow of current. The icicle shape of the pad pattern 169 may cause degradation in the structural and electrical characteristics of a portion of a channel structure 160.

To reduce or prevent such degradation, a process of widening an upper entrance of the channel hole 160H may be added before the channel layer 163 is formed such that design for efficiently separating the seam SM of the core insulating layer 167 from the pad pattern 169 may be applied to the integrated circuit device 100, according to the inventive concept. In addition, the structural reliability and electrical reliability of the channel structure 160 may be efficiently increased by separating the pad pattern 169 from the resistance change layer 165.

Eventually, according to the inventive concept, the integrated circuit device 100 may effectively suppress problems that may occur when the aspect ratio of the channel structure 160 increases with the increase of the height of the gate stack GS, thereby increasing the reliability and productivity of products.

Figure 7:
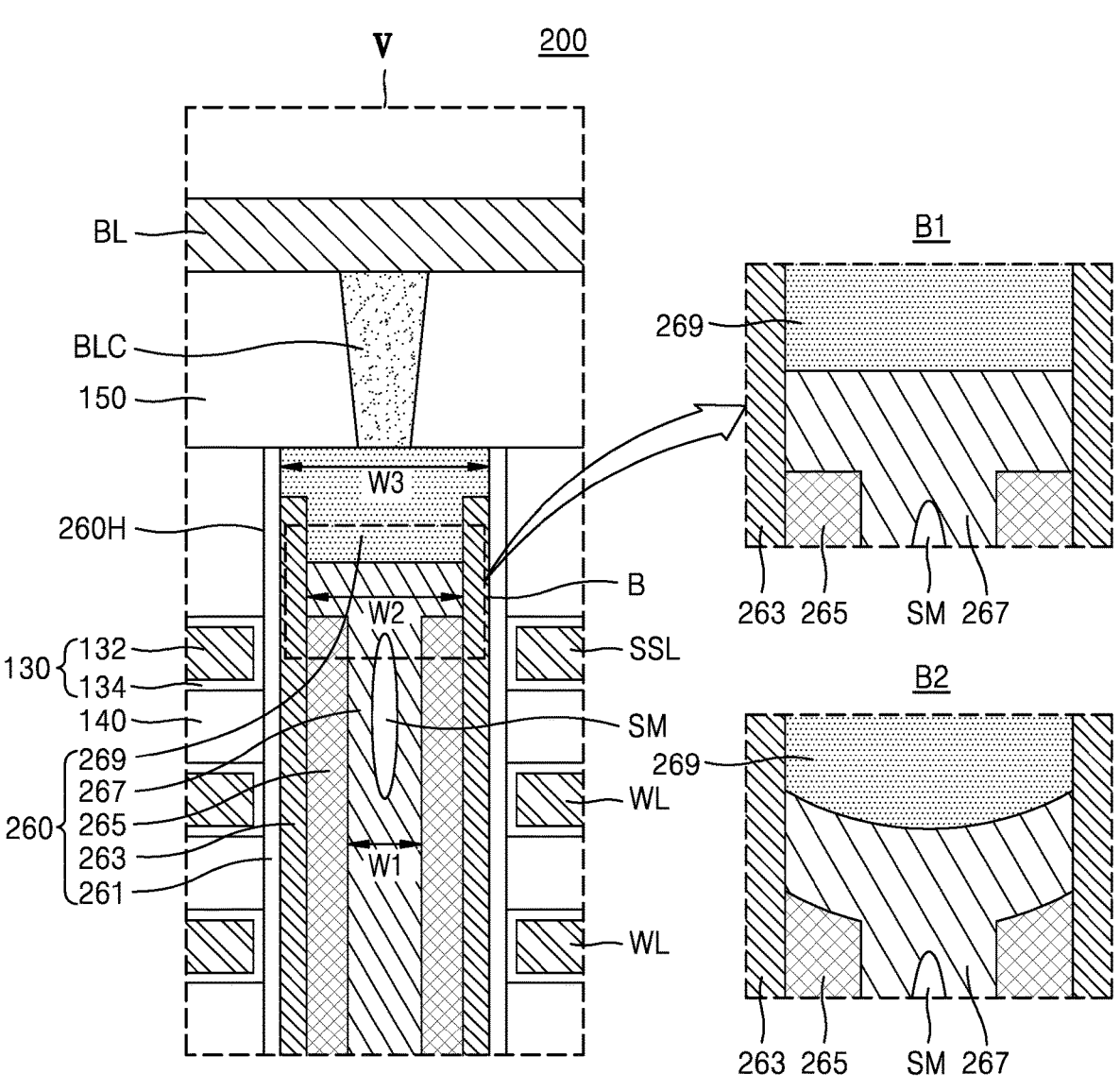
Figure 8:
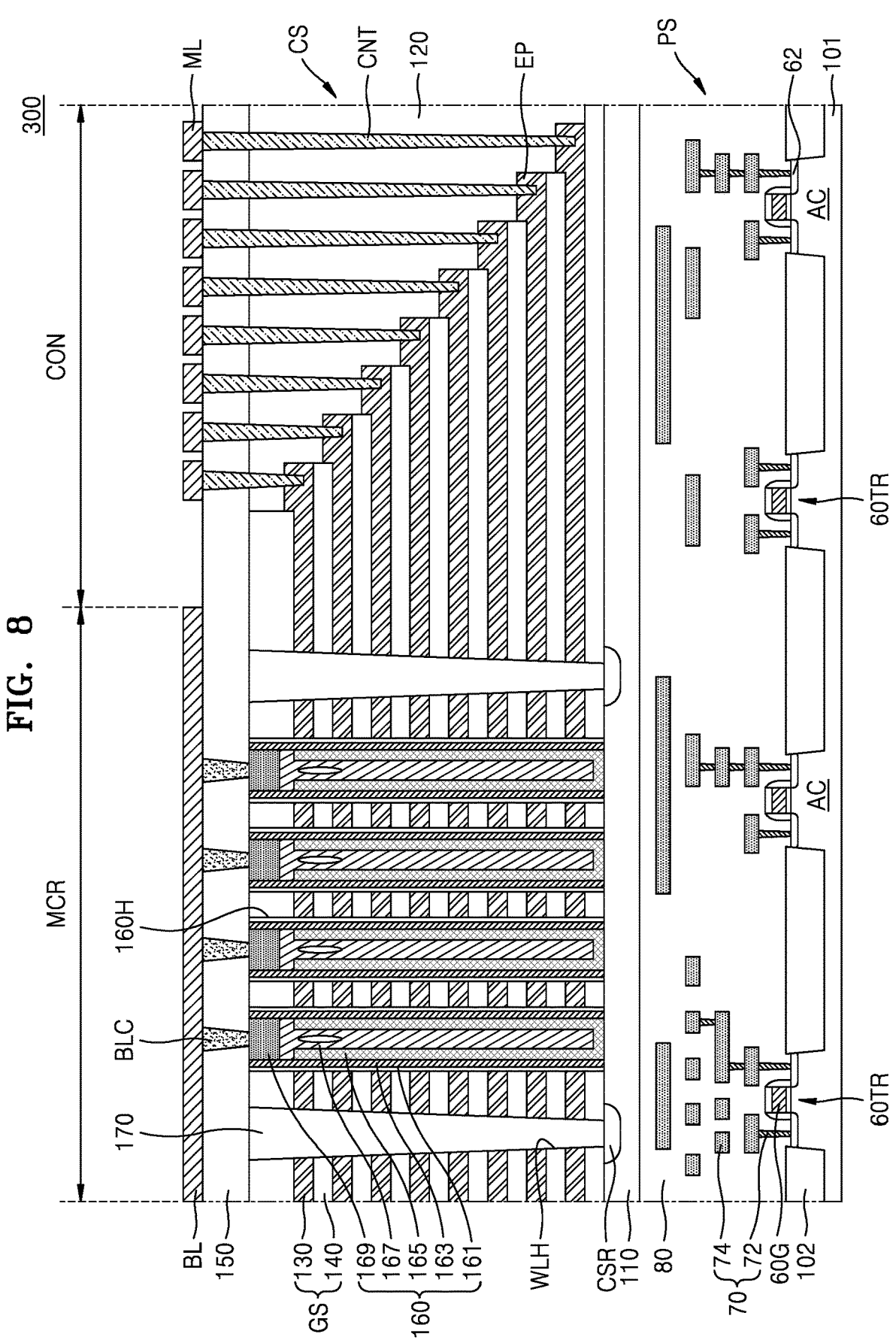
Figure 9:
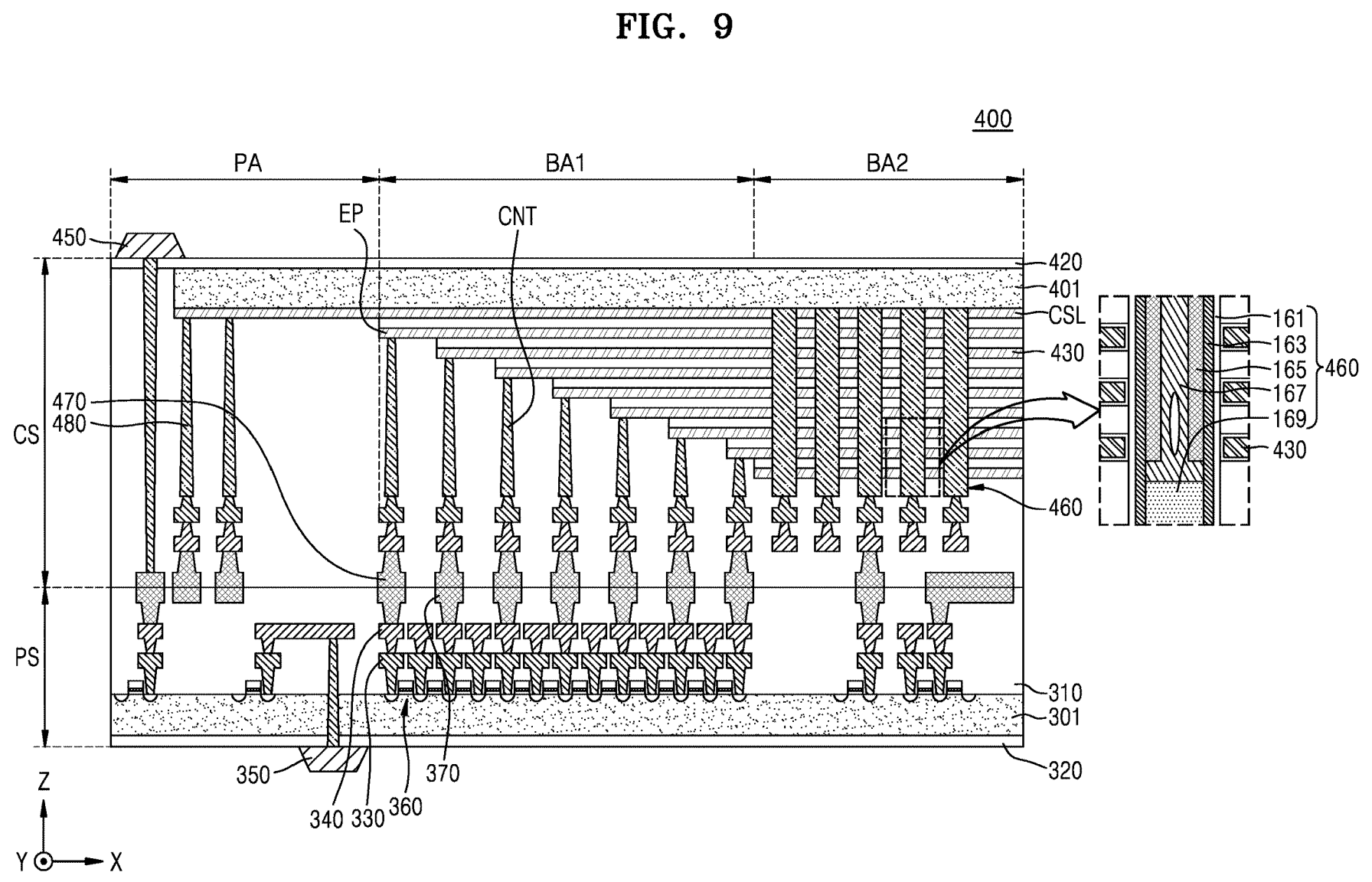

FIGS. 7 to 9 are cross-sectional views of integrated circuit devices according to some embodiments.

The elements of integrated circuit devices 200, 300, and 400 and the materials of the elements described below are mostly and substantially the same as or similar to those described above with reference to FIGS. 3 to 6. For convenience of description, therefore, the integrated circuit devices 200, 300, and 400 are described focusing on the differences from the integrated circuit device 100.

Referring to FIG. 7, the integrated circuit device 200 may include a plurality of channel structures 260.

According to the inventive concept, the structural characteristics of the channel structures 260 of the integrated circuit device 200 are described in detail below.

A dielectric layer 261 may completely cover the inside wall of a channel hole 260H. In some embodiments, the topmost surface of the dielectric layer 261 may be at a higher vertical level than the topmost surface of a channel layer 263 and the topmost surface of a resistance change layer 265 in the third direction (the Z direction) from the semiconductor substrate 101.

The channel layer 263 may cover most of the inside wall of the dielectric layer 261. The channel layer 263 may not cover an upper portion of the inside wall of the dielectric layer 261. In some embodiments, the channel layer 263 may have an annular shape in the channel hole 260H. The channel layer 263 may include a semiconductor material layer, such as a polysilicon layer.

The resistance change layer 265 may cover most of the inside wall of the channel layer 263. The resistance change layer 265 may not cover an upper portion of the inside wall of the channel layer 263. The resistance change layer 265 may include a material, of which the resistance varies with a voltage applied thereto.

A core insulating layer 267 may be in the central portion of the channel hole 260H and may fill the channel hole 260H. The core insulating layer 267 may extend in the third direction (the Z direction) and have a side wall, which faces the channel layer 263 and the resistance change layer 265. According to some embodiments, in a region B in FIG. 7, the topmost surface of the core insulating layer 267 may have a flat shape (see B1 in FIG. 7), and a pad pattern 269 may be formed along the flat shape of the core insulating layer 267. According to some embodiments, in the region B in FIG. 7, the topmost surface of the resistance change layer 265 may have an oblique shape and the topmost surface of the core insulating layer 267 may have a round shape that is concave upwards (see B2 in FIG. 7), and the pad pattern 269 (e.g., a lower surface of the pad pattern 269) may be convex downwards along the round shape of the core insulating layer 267. For example, the core insulating layer 267 may include silicon nitride. In some embodiments, the topmost surface of the resistance change layer 265 may be curved and inclined downwardly (i.e., toward the semiconductor substrate 101), and the topmost surface of the core insulating layer 267 and the lower surface of the pad pattern 269 may be curved downwardly as illustrated in B2 in FIG. 7.

A first horizontal width W1 of a first portion of the core insulating layer 267 may be less than a second horizontal width W2 of a second portion of the core insulating layer 267, wherein the side wall of the first portion of the core insulating layer 267 is in contact with the resistance change layer 265, and the side wall of the second portion of the core insulating layer 267 is in contact with the channel layer 263. The second horizontal width W2 of the second portion of the core insulating layer 267 may be less than a third horizontal width W3 of a third portion of the pad pattern 269, wherein the side wall of the third portion of the pad pattern 269 is in contact with the dielectric layer 261. A seam SM, which is a cavity or an empty space, may be in the first portion of the core insulating layer 267. The topmost surface of the second portion of the core insulating layer 267 may be in contact with the bottommost surface of the pad pattern 269. Accordingly, the seam SM may be spaced apart by a certain distance from the bottommost surface of the pad pattern 269 in the third direction (the Z direction).

The pad pattern 269 may be formed with a step between the respective topmost surfaces of the channel layer 263 and the core insulating layer 267 and may fill an upper portion of the channel hole 260H. In some embodiments, the pad pattern 269 may include a side wall portion on the channel layer 263 and a central portion on the core insulating layer 267. A vertical thickness of the side wall portion of the pad pattern 269 may be less than a vertical thickness of the central portion thereof. The side wall of the central portion of the pad pattern 269 may be in contact with the inside wall of the channel layer 263, and the side wall of the side wall portion of the pad pattern 269 may be coplanar with the outside wall of the channel layer 263. The topmost surface of the pad pattern 269 may be at the same vertical level (e.g., substantially at the same vertical level) as the topmost surface of the dielectric layer 261 from the semiconductor substrate 101. Accordingly, the bottommost surface of the pad pattern 269 may be spaced apart from the topmost surface of the resistance change layer 265.

Referring to FIG. 8, the integrated circuit device 300 may include a peripheral structure PS and a cell array structure CS, which is at a higher vertical level than the peripheral structure PS from the semiconductor substrate 101.

The integrated circuit device 300 may have a cell-on-periphery (COP) structure, in which the cell array structure CS is arranged on the peripheral structure PS. A base structure 110 may be between the peripheral structure PS and the cell array structure CS.

The peripheral structure PS may include a peripheral transistor 60TR and a peripheral wiring 70, which are arranged on the semiconductor substrate 101. An active region AC may be identified by an isolation film 102 in the semiconductor substrate 101. A plurality of peripheral transistors 60TR may be formed on the active region AC. Each of the peripheral transistors 60TR may include a peripheral gate 60G and a source/drain region 62 in a portion of the semiconductor substrate 101, wherein the source/drain region 62 is at opposite sides of the peripheral gate 60G.

The peripheral wiring 70 may include a plurality of peripheral contacts 72 and a plurality of peripheral metal layers 74. An interlayer insulating film 80 may be on the semiconductor substrate 101 and cover the peripheral transistors 60TR and the peripheral wiring 70. The peripheral metal layers 74 may have a multi-layer structure including a plurality of metal layers at different vertical levels. Although it is illustrated that the peripheral metal layers 74 have the same height as each other, peripheral metal layers 74 at some levels (e.g., at a top level) may have a greater height than the peripheral metal layers 74 at the other levels.

Referring to FIG. 9, the integrated circuit device 400 may include a chip-to-chip structure.

According to some embodiments, the integrated circuit device 400 includes a chip-to-chip structure formed by manufacturing an upper chip including the cell array structure CS, manufacturing a lower chip including the peripheral structure PS, and then connecting the upper chip to the lower chip in a bonding manner.

In some embodiments, the bonding manner may include a method of allowing a bonding pad formed at the top of the upper chip to contact a bonding pad formed at the top of the lower chip. The bonding manner may include a metal-to-metal bonding structure, a through silicon via (TSV), a back via stack (BVS), a eutectic bonding structure, a ball grid array (BGA) bonding structure, a plurality of wiring lines, or a combination thereof.

The peripheral structure PS may include a circuit substrate 301, an interlayer insulating layer 310, a plurality of circuit elements 360, a first metal layer 330 connected to each of the circuit elements 360, and a second metal layer 340 on the first metal layer 330.

The interlayer insulating layer 310 may be on the circuit substrate 301 to cover the circuit elements 360, the first metal layer 330, and the second metal layer 340 and may include an insulating material.

A lower bonding pad 370 may be on the second metal layer 340 of a word line bonding area BA1. In the word line bonding area BA1, the lower bonding pad 370 of the peripheral structure PS may be electrically connected to an upper bonding pad 470 of the cell array structure CS in a bonding manner.

The cell array structure CS may provide at least one memory cell block. The cell array structure CS may include a cell substrate 401 and a common source line CSL. A plurality of word lines 430 may be stacked on the cell substrate 401 in the third direction (the Z direction).

In a bit line bonding area BA2, a channel structure 460 may pass through the word lines 430, string select lines, and a ground select line in the third direction (the Z direction). The channel structure 460 may include the dielectric layer 161, the channel layer 163 on the inside wall of the dielectric layer 161, the resistance change layer 165 on the inside wall of the channel layer 163, the core insulating layer 167 in a central portion thereof, and the pad pattern 169 covering the top surface of the core insulating layer 167.

In the word line bonding area BA1, the word lines 430 may extend in parallel with the top surface of the cell substrate 401 and may be respectively connected to a plurality of contact plugs CNT. The contact plugs CNT may be connected to the word lines 430 in elevated end portions EP provided as the word lines 430 extend in different lengths from each other.

A common source line contact 480 may be in an external pad bonding area PA. The common source line contact 480 may include a conductive material, such as metal, a metal compound, or polysilicon, and may be electrically connected to the common source line CSL.

First and second I/O pads 350 and 450 may be in the external pad bonding area PA. A lower film 320 may be formed below the circuit substrate 301 and cover the bottom surface of the circuit substrate 301. The first I/O pad 350 may be formed on the lower film 320. An upper film 420 may be formed on the cell substrate 401 and cover the top surface of the cell substrate 401. The second I/O pad 450 may be on the upper film 420.

Eventually, according to the inventive concept, the channel structure 160, 260 or 460 of each of the integrated circuit devices 200, 300, and 400 is formed by using design for efficiently separating a cavity (e.g., the seam SM) of the core insulating layer 167 or 267 from the pad pattern 169 or 269, and accordingly, the structural reliability and electrical reliability of the channel structures 160 and 260 may be efficiently increased.

FIG. 10 is a flowchart of a method of manufacturing an integrated circuit device, according to some embodiments.

Referring to FIG. 10, a method S10 of manufacturing an integrated circuit device may include first to sixth operations S110 to S160. In some embodiments, the first to sixth operations S110 to S160 may be performed sequentially.

When it is possible to modify an embodiment, the order of operations may be different from the order in which the operations are described. For instance, two operations described as being performed sequentially may be substantially performed simultaneously or in a reverse order.

The method S10 may include sequentially forming a dielectric layer, a channel layer, a resistance change layer, and a core sacrificial layer in a channel hole in the first operation S110, forming a resistance change recess by etching a portion of the resistance change layer in the second operation S120, forming a core space by removing the core sacrificial layer in the third operation S130, forming a core insulating layer filling the core space in the fourth operation S140, forming a core recess by etching a portion of the core insulating layer in the fifth operation S150, and forming a pad pattern filling the core recess in the sixth operation S160.

The technical characteristics of each of the first to sixth operations S110 to S160 are described in detail below with reference to FIGS. 11A to 11F.

FIGS. 11A to 11F are cross-sectional views illustrating a method of manufacturing an integrated circuit device, according to some embodiments.

In the present embodiment, an example method of manufacturing the integrated circuit device 100 described with reference to FIGS. 3 to 6 is described. For convenience of description, only a part of FIG. 4 is illustrated, but one of ordinary skill in the art will be able to infer the other part of FIG. 4.

Figure 11A:
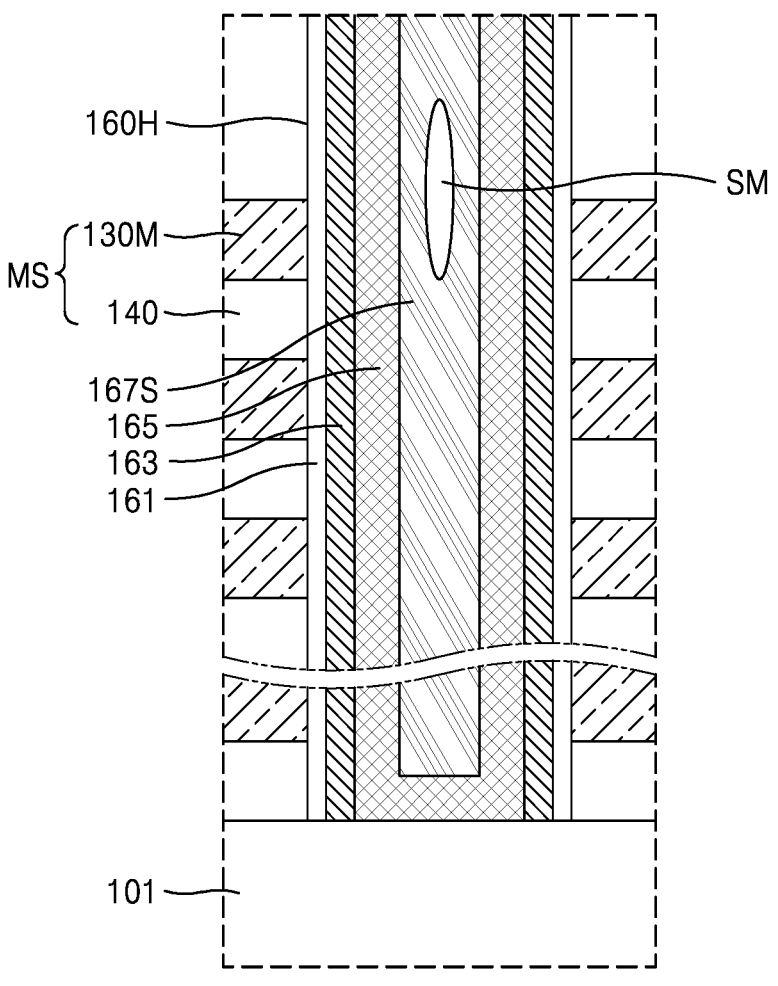
FIGS. 11A to 11F are cross-sectional views illustrating a method of manufacturing an integrated circuit device, according to some embodiments.

Referring to FIG. 11A, a mold stack MS may be formed by alternately stacking a plurality of insulating layers 140 and a plurality of mold layers 130M on the semiconductor substrate 101.

The mold layers 130M may provide spaces for forming a ground select line GSL, a plurality of word lines WL, and a plurality of string select lines SSL in subsequent processes. The mold layers 130M may include silicon nitride, silicon oxynitride, or impurity-doped polysilicon.

The insulating layers 140 may include an insulating material, such as silicon oxide or silicon oxynitride. The insulating layers 140 may include a material having a different etch selectivity than the mold layers 130M.

The insulating layers 140 and the mold layers 130M may be formed by chemical vapor deposition (CVD), plasma enhanced CVD (PECVD), or atomic layer deposition (ALD).

Subsequently, a channel hole 160H exposing the semiconductor substrate 101 may be formed by etching the mold stack MS. After a mask pattern (not shown) having an opening is formed on the mold stack MS, the channel hole 160H may be formed by using the mask pattern as an etch mask. The mask pattern may be formed by photolithography. The mask pattern may be removed after an etching process for the formation of the channel hole 160H is completely performed.

Subsequently, a dielectric layer 161, a channel layer 163, a resistance change layer 165, and a core sacrificial layer 167S may be sequentially formed in the channel hole 160H. In detail, the dielectric layer 161 and the channel layer 163 may be conformally formed on the side walls of the channel hole 160H, and the resistance change layer 165 may be conformally formed on the side walls and the bottom of the channel hole 160H. The core sacrificial layer 167S may be formed on the resistance change layer 165 to fill the remaining space of the channel hole 160H. The core sacrificial layer 167S may include a seam SM.

Figure 11B:
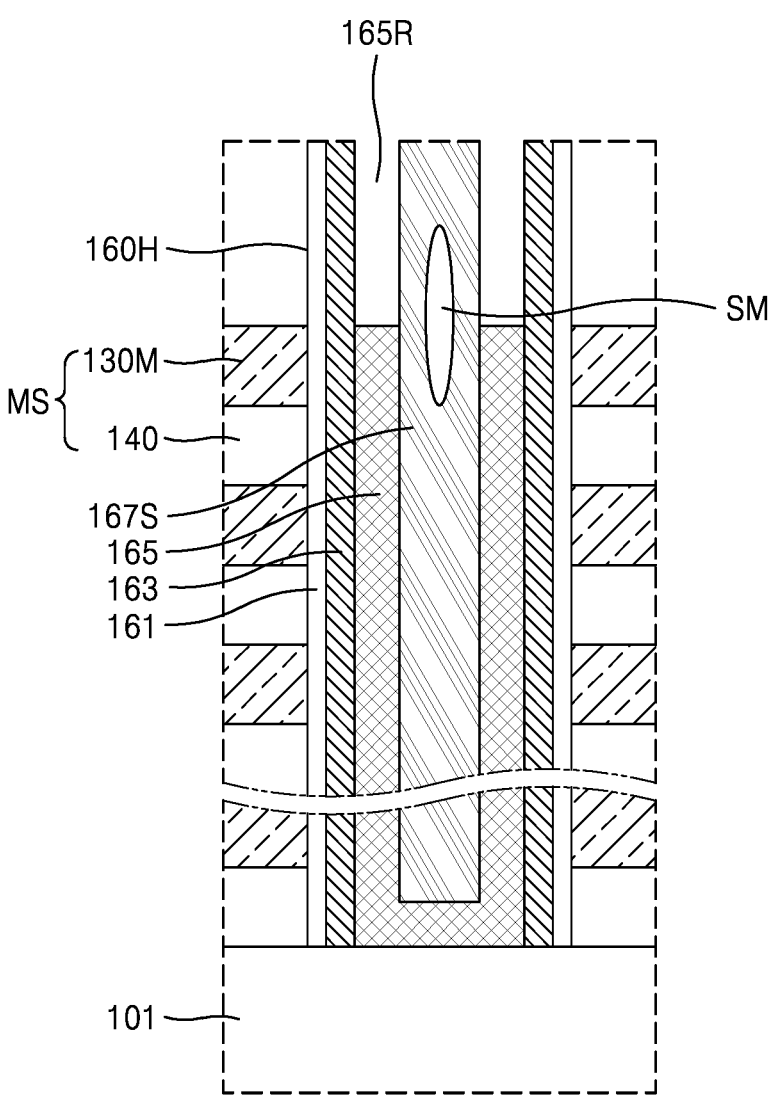

Referring to FIG. 11B, a resistance change recess 165R may be formed by etching a portion of the resistance change layer 165.

In some embodiments, after a mask pattern (not shown) having an opening is formed on the channel hole 160H, the resistance change recess 165R may be formed by dry etching a portion of the resistance change layer 165 by using the mask pattern as an etch mask.

In some embodiments, the resistance change recess 165R may be formed by wet etching a portion of the resistance change layer 165 by using an etch selectivity of a material of the resistance change layer 165 with respect to other materials.

Figure 11C:
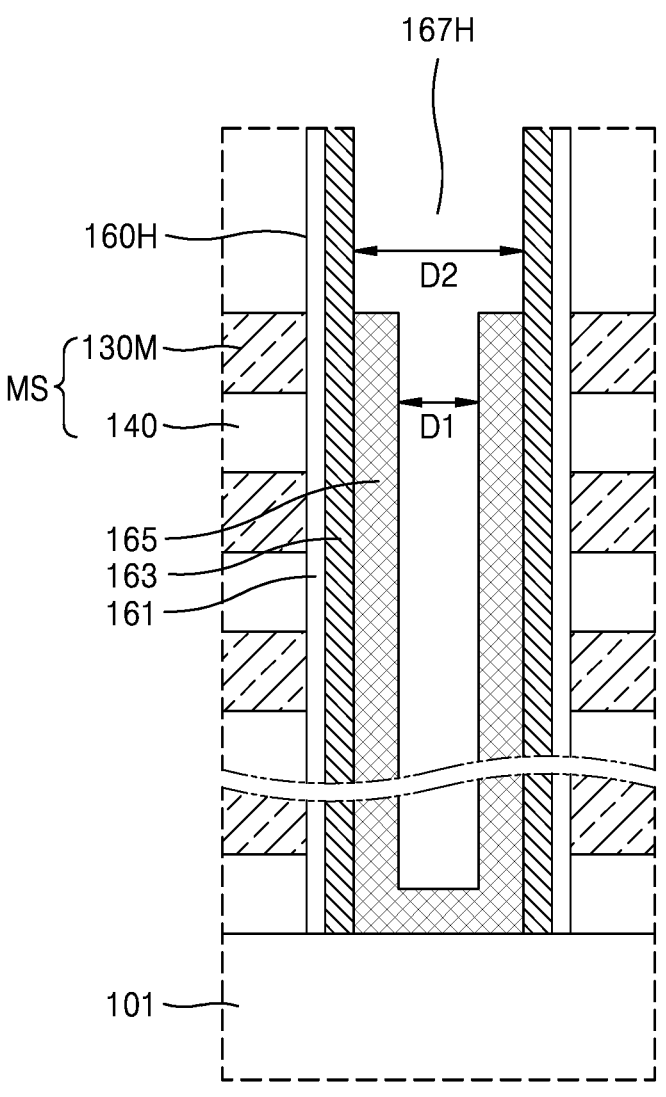

Referring to FIG. 11C, a core space 167H may be formed by completely removing the core sacrificial layer 167S (see FIG. 11B).

The core space 167H may be formed in the channel hole 160H by selectively removing the core sacrificial layer 167S (in FIG. 11B) by using wet etching. The inside walls and top surface of the resistance change layer 165 and respective portions of the inside walls of the channel layer 163 may be exposed by the core space 167H.

Here, in the core space 167H, a first distance D1 between the inside walls of the resistance change layer 165 may be less than a second distance D2 between the inside walls of the channel layer 163.

Figure 11D:
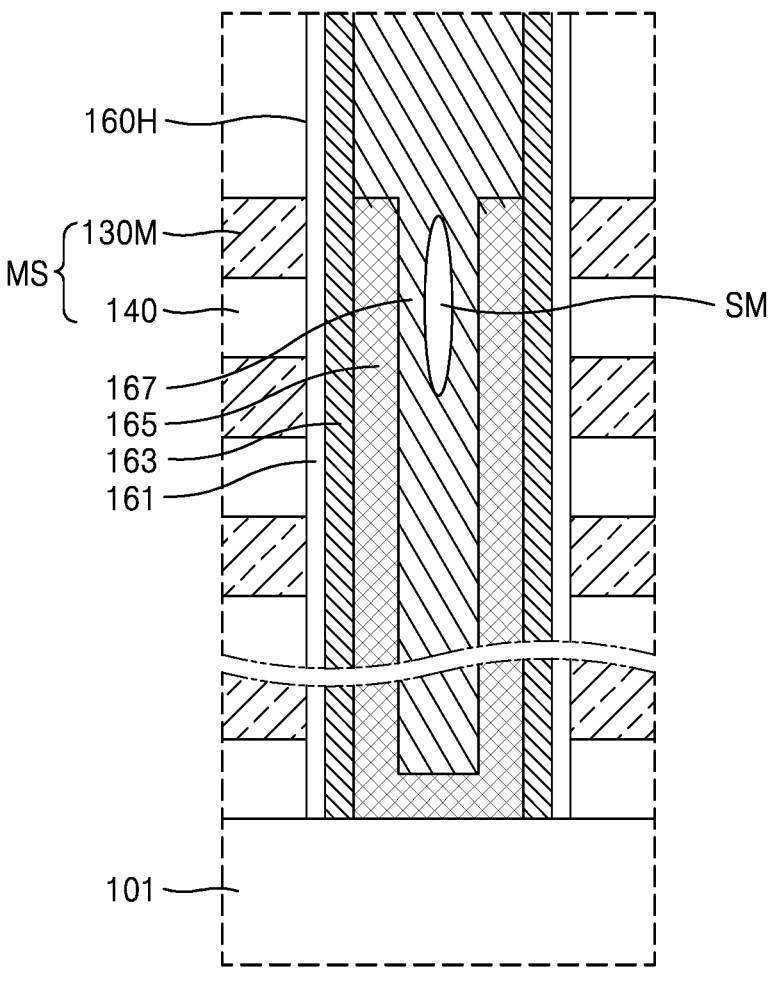

Referring to FIG. 11D, a core insulating layer 167 may be formed to fill the core space 167H (see FIG. 11C).

The core insulating layer 167 may include a seam SM, i.e., a cavity or an empty space, in its central portion near the resistance change layer 165. Because the entrance of the core space 167H (see FIG. 11C) is relatively wide as an upper portion of the resistance change layer 165 is etched, the seam SM may be relatively far apart from the top surface of the core insulating layer 167.

Figure 11E:
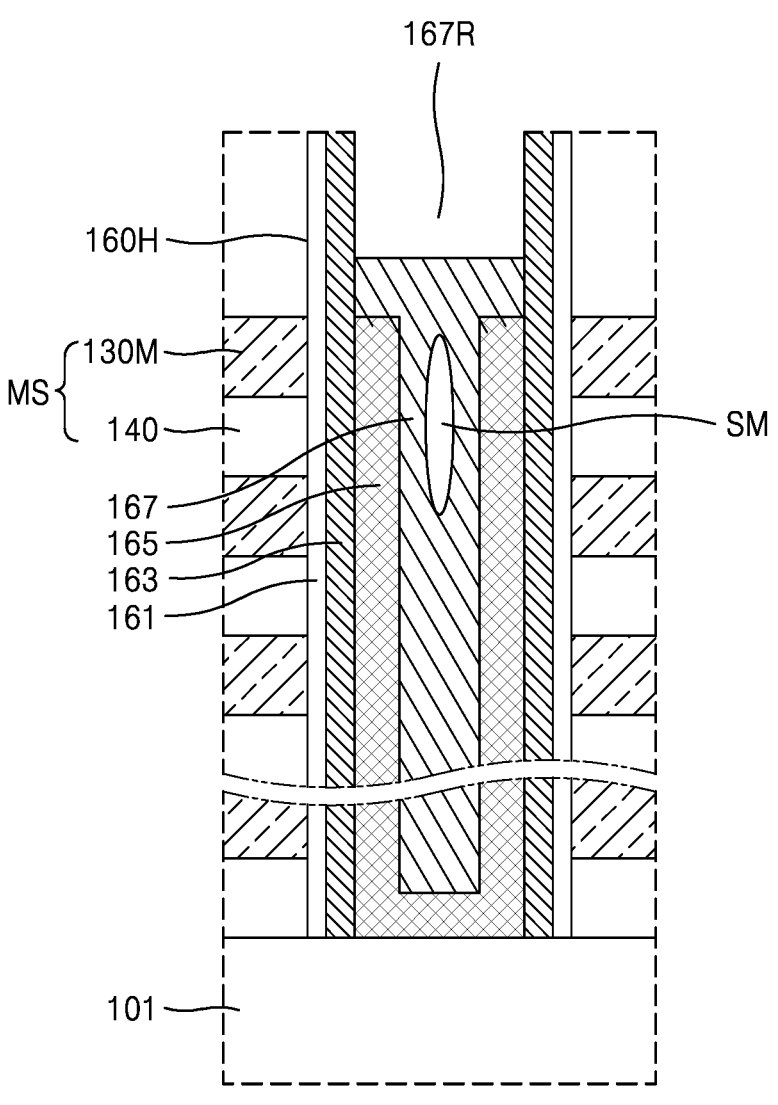

Referring to FIG. 11E, a core recess 167R may be formed by etching a portion of the core insulating layer 167.

In some embodiments, after a mask pattern (not shown) having an opening may be formed on the channel hole 160H, the core recess 167R may be formed by dry etching a portion of the core insulating layer 167 by using the mask pattern as an etch mask.

In some embodiments, the core recess 167R may be formed by wet etching a portion of the core insulating layer 167 by using an etch selectivity of a material of the core insulating layer 167 with respect to other materials.

Figure 11F:
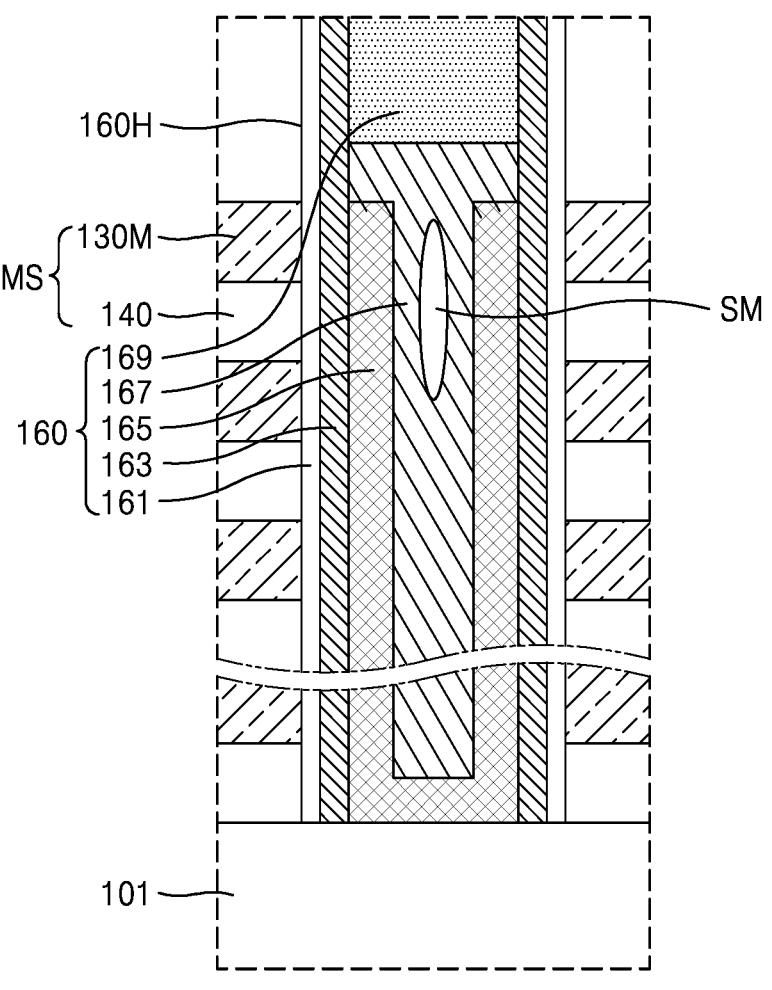

Referring to FIG. 11F, a pad pattern 169 may be formed to fill the core recess 167R.

The pad pattern 169 may be formed to be in contact with the topmost surface of the core insulating layer 167 and with the inside walls of the channel layer 163 and may be spaced apart from the resistance change layer 165 and thus may be spaced apart from the seam SM of the core insulating layer 167 in a vertical direction.

In some embodiments, the bottom surface of the pad pattern 169 may have a flat shape. However, embodiments are not limited thereto. In some embodiments, the pad pattern 169 may be convex downwards along the shape of the core recess 167R.

Referring back to FIG. 4, a word line cut opening WLH may be formed by etching a portion of the mold stack MS, and a common source region CSR may be formed by implanting impurity ions into the semiconductor substrate 101 exposed by the word line cut opening WLH. Subsequently, the mold layers 130M may be removed and replaced with a plurality of conductive lines 130 through the word line cut opening WLH. Subsequently, a word line cut 170 may be formed in the word line cut opening WLH, and an upper insulating layer 150 may be formed. Subsequently, a plurality of bit line contacts BLC may be formed such that each of the bit line contacts BLC passes through the upper insulating layer 150 and is in contact with the pad pattern 169, and a plurality of bit lines BL may be formed to be connected to the bit line contacts BLC.

Through the manufacturing processes described above, the integrated circuit device 100 of the inventive concept may be manufactured. Eventually, according to the inventive concept, the integrated circuit device 100 may effectively suppress problems that may occur when the aspect ratio of the channel structure 160 increases with the increase of the height of the gate stack GS, thereby increasing the reliability and productivity of products.

FIG. 12 is a flowchart of a method of manufacturing an integrated circuit device, according to some embodiments.

Referring to FIG. 12, a method S20 of manufacturing an integrated circuit device may include first to seventh operations S210 to S270. In some embodiments, the first to seventh operations S210 to S270 may be performed sequentially.

The method S20 may include sequentially forming a dielectric layer, a channel layer, a resistance change layer, and a core sacrificial layer in a channel hole in the first operation S210, forming a channel recess by etching a portion of the channel layer in second operation S220, forming a resistance change recess by etching a portion of the resistance change layer in the third operation S230, forming a core space by removing the core sacrificial layer in the fourth operation S240, forming a core insulating layer filling the core space in the fifth operation S250, forming a core recess by etching a portion of the core insulating layer in the sixth operation S260, and forming a pad pattern filling the core recess in the seventh operation S270.

The technical characteristics of each of the first to seventh operations S210 to S270 are described in detail below with reference to FIGS. 13A to 13G.

FIGS. 13A to 13G are cross-sectional views illustrating a method of manufacturing an integrated circuit device, according to some embodiments.

In the present embodiments, an example method of manufacturing the integrated circuit device 200 described with reference to FIGS. 3, 4, and 7 is described. For convenience of description, only a part of FIG. 4 is illustrated, but one of ordinary skill in the art will be able to infer the other part of FIG. 4.

Figure 13A:
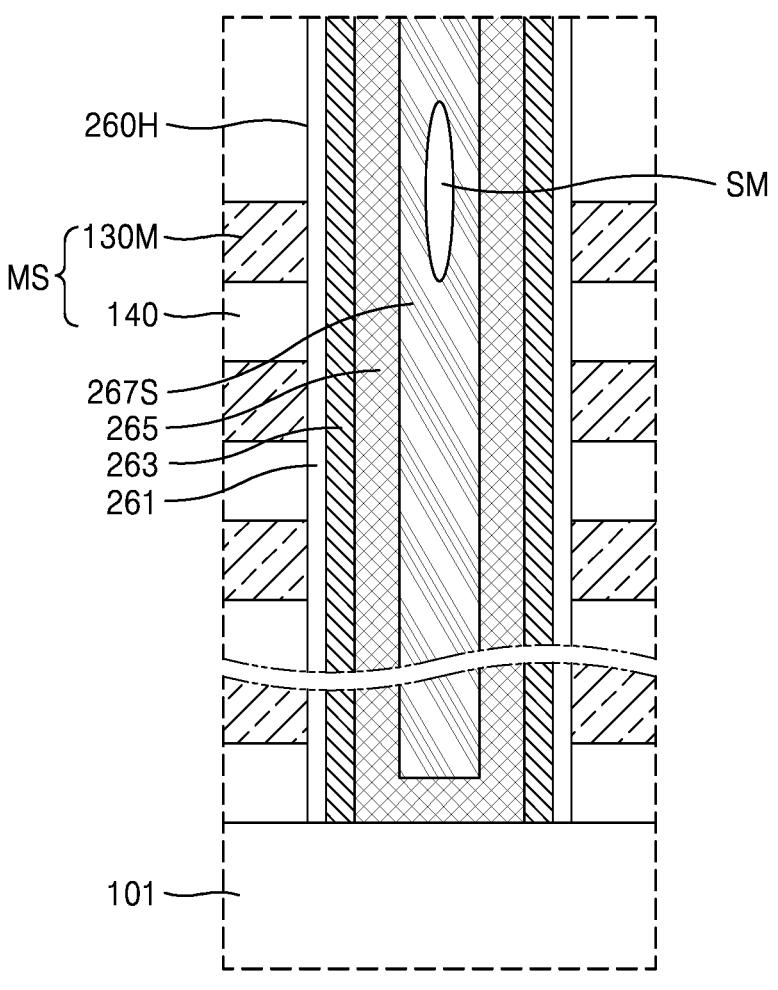
FIGS. 13A to 13G are cross-sectional views illustrating a method of manufacturing an integrated circuit device, according to some embodiments.

Referring to FIG. 13A, a mold stack MS may be formed by alternately stacking a plurality of insulating layers 140 and a plurality of mold layers 130M on the semiconductor substrate 101.

A process of forming the mold stack MS and a process of sequentially forming a dielectric layer 261, a channel layer 263, a resistance change layer 265, and a core sacrificial layer 267S are substantially the same of those described above with reference to FIG. 11A, and thus, detailed descriptions thereof are omitted.

Figure 13B:
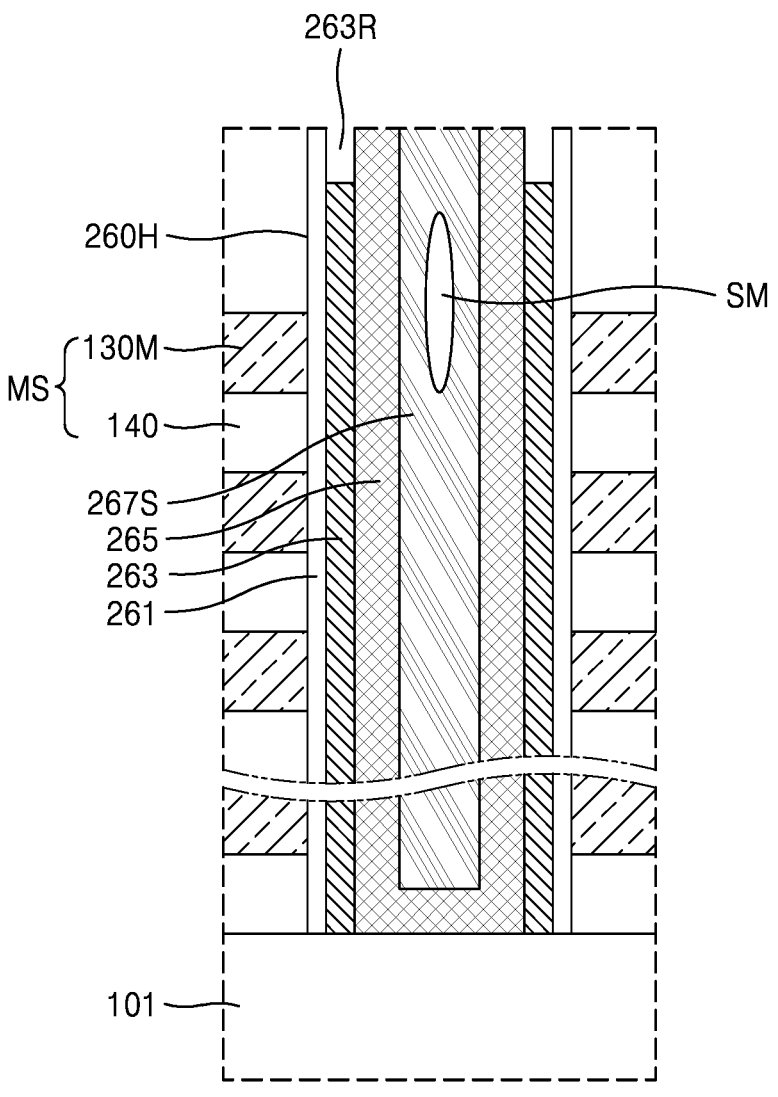

Referring to FIG. 13B, a channel recess 263R may be formed by etching a portion of the channel layer 263.

In some embodiments, after a mask pattern (not shown) having an opening is formed on the channel hole 260H, the channel recess 263R may be formed by dry etching a portion of the channel layer 263 by using the mask pattern as an etch mask.

In some embodiments, the channel recess 263R may be formed by wet etching a portion of the channel layer 263 by using an etch selectivity of a material of the channel layer 263 with respect to other materials.

Figure 13C:
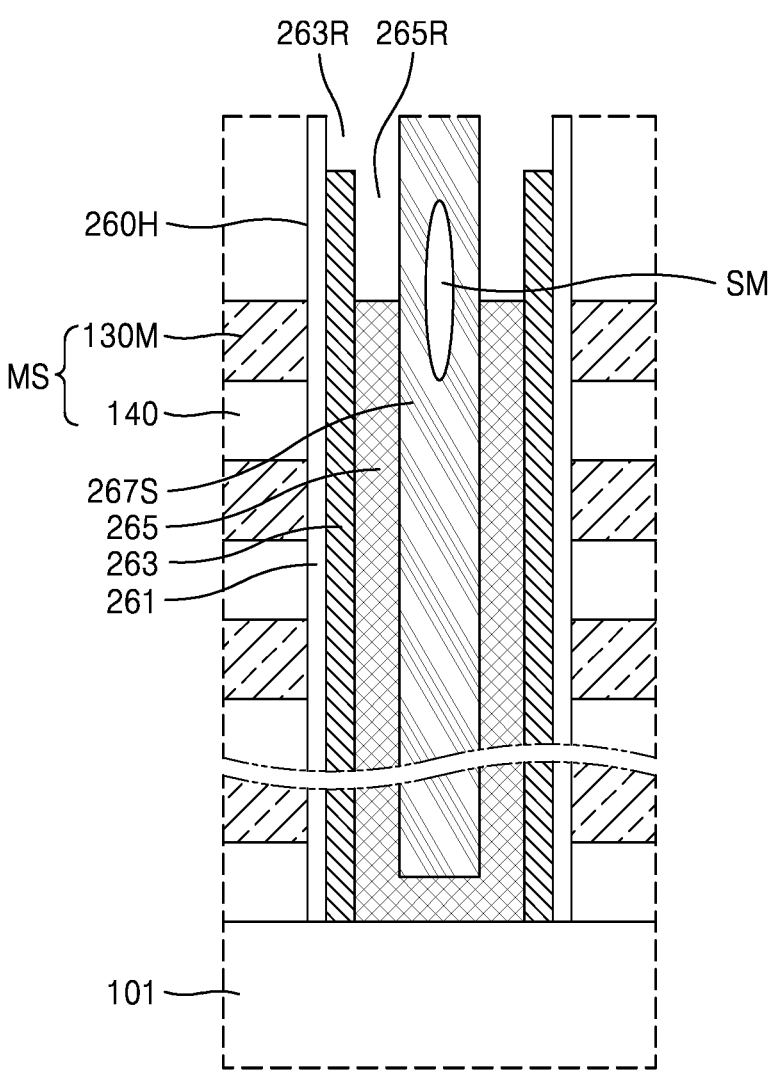

Referring to FIG. 13C, a resistance change recess 265R may be formed by etching a portion of the resistance change layer 265.

In some embodiments, after a mask pattern (not shown) having an opening is formed on the channel hole 260H, the resistance change recess 265R may be formed by dry etching a portion of the resistance change layer 265 by using the mask pattern as an etch mask.

In some embodiments, the resistance change recess 265R may be formed by wet etching a portion of the resistance change layer 265 by using an etch selectivity of a material of the resistance change layer 265 with respect to other materials.

The vertical depth of the resistance change recess 265R may be greater than the vertical depth of the channel recess 263R.

Figure 13D:
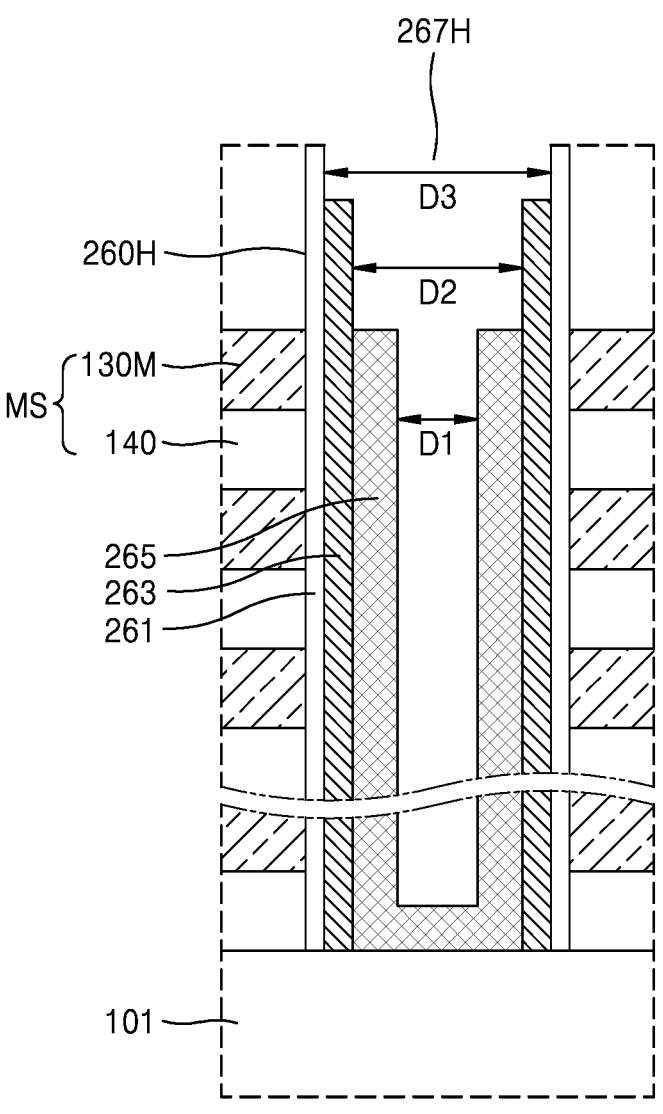

Referring to FIG. 13D, a core space 267H may be formed by completely removing the core sacrificial layer 267S (see FIG. 13C).

The core space 267H may be formed in the channel hole 260H by selectively removing the core sacrificial layer 267S (in FIG. 13C) by using wet etching. The inside walls and top surface of the resistance change layer 265 and respective portions of the inside walls of the channel layer 263 may be exposed by the core space 267H.

Here, in the core space 267H, a first distance D1 between the inside walls of the resistance change layer 265 may be less than a second distance D2 between the inside walls of the channel layer 263, and the second distance D2 between the inside walls of the channel layer 263 may be less than a third distance D3 between the inside walls of the dielectric layer 261.

Figure 13E:
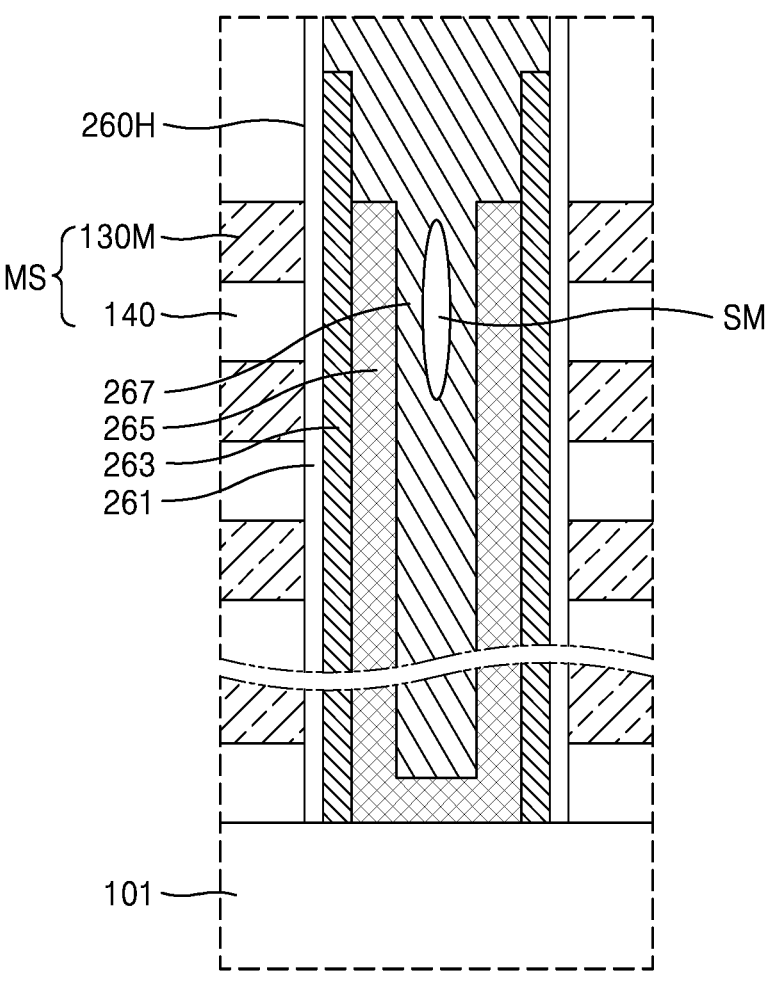

Referring to FIG. 13E, a core insulating layer 267 may be formed to fill the core space 267H (see FIG. 13D).

The core insulating layer 267 may include a seam SM, i.e., a cavity or an empty space, in its central portion near the resistance change layer 265. Because the entrance of the core space 267H (see FIG. 13D) is relatively wide as an upper portion of the resistance change layer 265 is etched, the seam SM may be relatively far apart from the top surface of the core insulating layer 267.

Figure 13F:
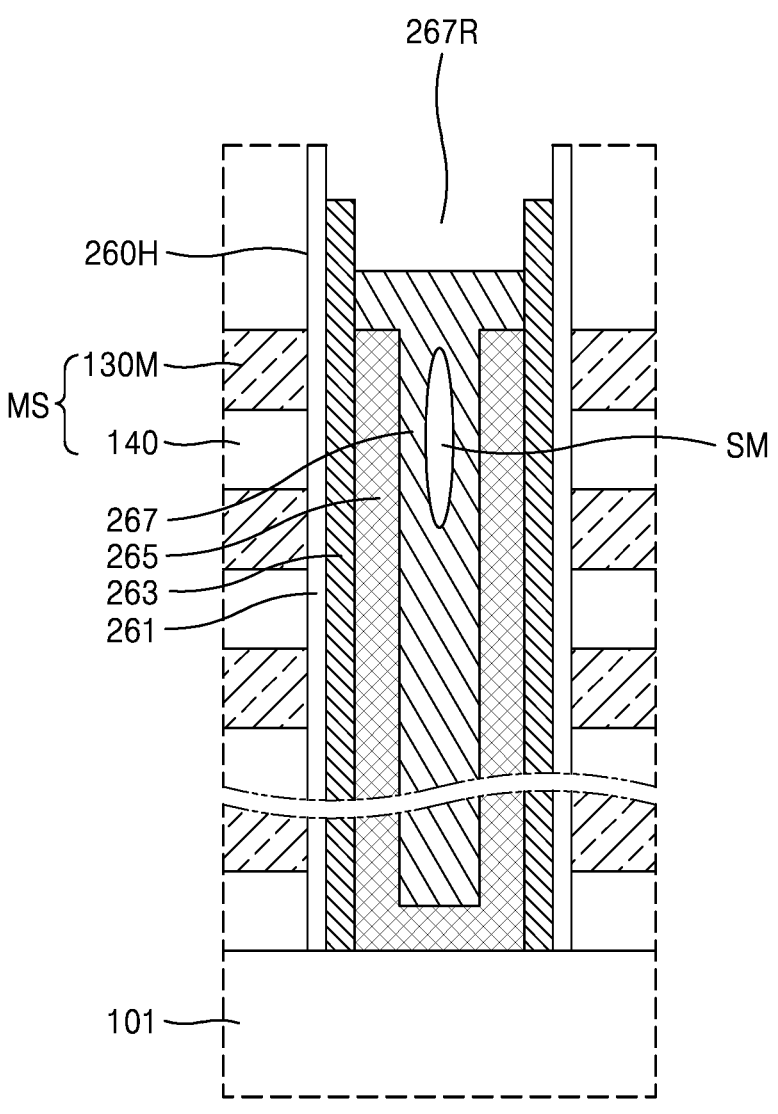

Referring to FIG. 13F, a core recess 267R may be formed by etching a portion of the core insulating layer 267.

In some embodiments, after a mask pattern (not shown) having an opening may be formed on the channel hole 260H, the core recess 267R may be formed by dry etching a portion of the core insulating layer 267 by using the mask pattern as an etch mask.

In some embodiments, the core recess 267R may be formed by wet etching a portion of the core insulating layer

267 by using an etch selectivity of a material of the core insulating layer 267 with respect to other materials.

Figure 13G:
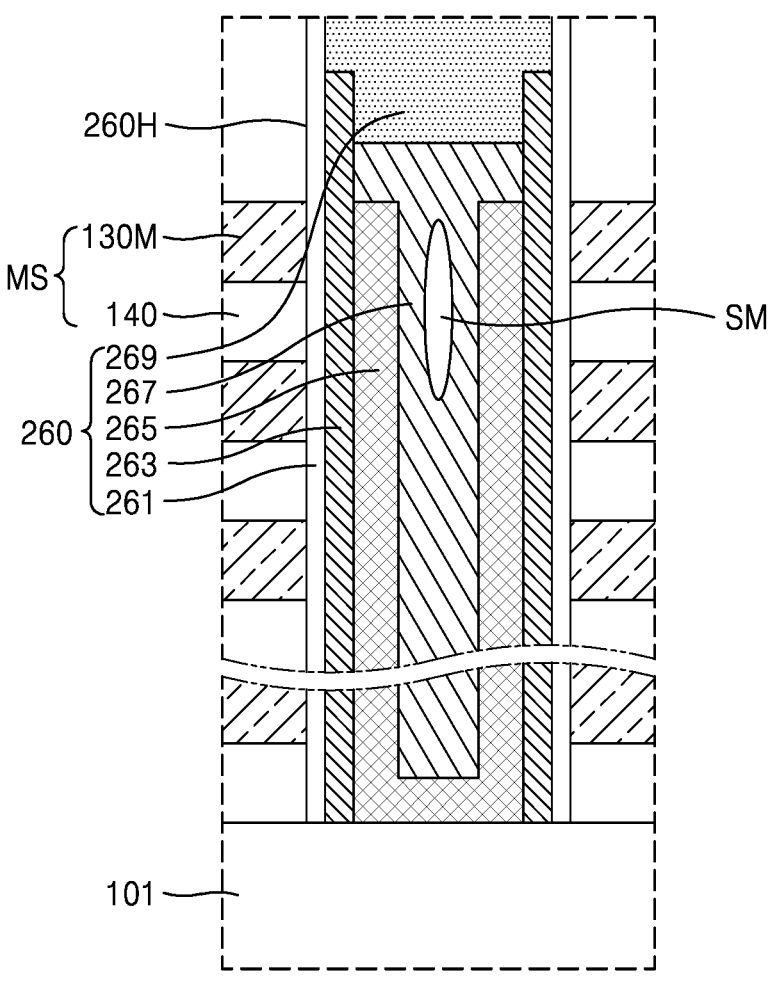

Referring to FIG. 13G, a pad pattern 269 may be formed to fill the core recess 267R.

The pad pattern 269 may be formed to be in contact with the top surface of the core insulating layer 267, with the inside walls of the channel layer 263, and with the inside walls of the dielectric layer 261 and may be spaced apart from the resistance change layer 265 and thus may be spaced apart from the seam SM of the core insulating layer 267 in a vertical direction.

In some embodiments, the bottom surface of the pad pattern 269 may have a flat shape. However, embodiments are not limited thereto. In some embodiments, the pad pattern 269 may be convex downwards along the shape of the core recess 267R.

Referring back to FIG. 4, the integrated circuit device 200 of the inventive concept may be manufactured.

Through the manufacturing processes described above, the integrated circuit device 200 of the inventive concept may be manufactured. Eventually, according to the inventive concept, the integrated circuit device 200 may effectively suppress problems that may occur when the aspect ratio of the channel structure 260 increases with the increase of the height of the gate stack GS, thereby increasing the reliability and productivity of products.

Figure 14:
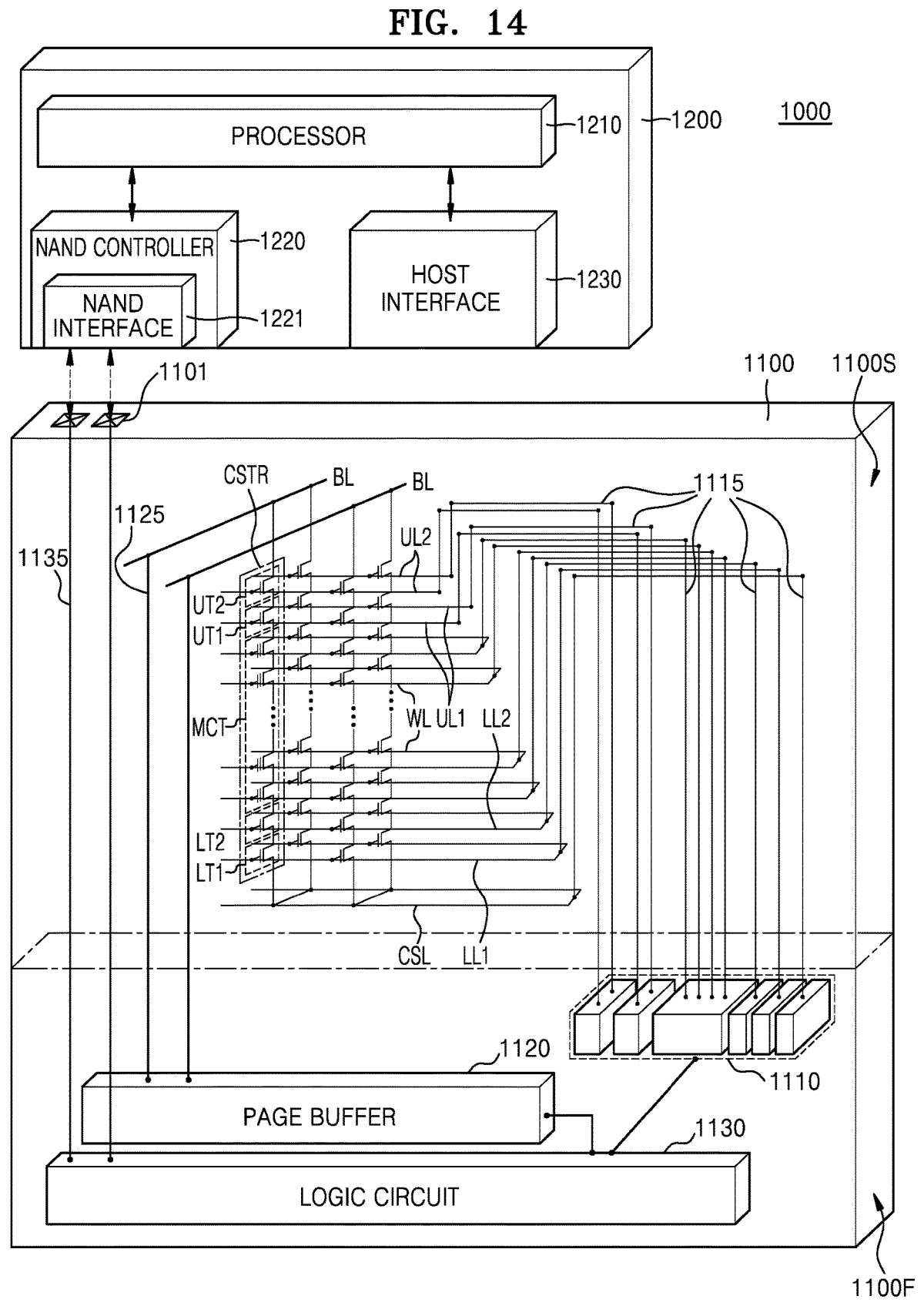

FIG. 14 is a diagram of an electronic system including an integrated circuit device, according to some embodiments.

Referring to FIG. 14, an electronic system 1000 may include an integrated circuit device 1100 and a controller 1200 electrically connected to the integrated circuit device 1100.

The electronic system 1000 may be a storage device including one or more integrated circuit devices 1100 or an electronic device including the storage device. For example, the electronic system 1000 may be any one of a solid state drive (SSD) device, a universal serial bus (USB) device, a computing system, a medical device, and a communication device, each of which includes at least one integrated circuit device 1100.

The integrated circuit device 1100 may include a non-volatile vertical memory device. For example, the integrated circuit device 1100 may include a NAND flash memory device including at least one of the integrated circuit devices 100, 200, 300, and 400 described with reference to FIGS. 3 to 9. The integrated circuit device 1100 may include a first structure 1100F and a second structure 1100S on the first structure 1100F. In some embodiments, the first structure 1100F may be next to the second structure 1100S.

The first structure 1100F may be a peripheral circuit structure, which includes a decoder circuit 1110, a page buffer 1120, and a logic circuit 1130. The second structure 1100S may be a memory cell structure, which includes a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the memory cell strings CSTR may include lower transistors LT1 and LT2 near the common source line CSL, upper transistors UT1 and UT2 near the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may vary with embodiments.

In some embodiments, the upper transistors UT1 and UT2 may include a string select transistor, and the lower transistors LT1 and LT2 may include a ground select transistor. The first and second gate lower lines LL1 and LL2 may respectively be respective gate electrodes of the lower transistors LT1 and LT2. Each of the word lines WL may be a gate electrode of a memory cell transistor MCT. The first and second gate upper lines UL1 and UL2 may respectively be respective gate electrodes of the upper transistors UT1 and UT2.

The common source line CSL, the first and second gate lower lines LL1 and LL2, the word lines WL, and the first and second gate upper lines UL1 and UL2 may be electrically connected to the decoder circuit 1110 through a plurality of first interconnection lines 1115 extending from the first structure 1100F to the second structure 1100S. A plurality of bit lines BL may be electrically connected to the page buffer 1120 through a plurality of second interconnection lines 1125 extending from the first structure 1100F to the second structure 1100S.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The integrated circuit device 1100 may communicate with the controller 1200 through an I/O pad 1101, which is electrically connected to the logic circuit 1130. The I/O pad 1101 may be electrically connected to the logic circuit 1130 through an I/O interconnection line 1135 extending from the first structure 1100F to the second structure 1100S.

The controller 1200 may include a processor 1210, a NAND controller 1220, and a host interface 1230. In some embodiments, the electronic system 1000 may include a plurality of integrated circuit devices 1100. In this case, the controller 1200 may control the integrated circuit devices 1100.

The processor 1210 may generally control the operations of the electronic system 1000 including the controller 1200. The processor 1210 may operate according to certain firmware and may control the NAND controller 1220 to access the integrated circuit device 1100. The NAND controller 1220 may include a NAND interface 1221 communicating with the integrated circuit device 1100. A control command for controlling the integrated circuit device 1100, data to be written to the memory cell transistors MCT of the integrated circuit device 1100, data read from the memory cell transistors MCT of the integrated circuit device 1100, and/or the like may be transmitted through the NAND interface 1221. The host interface 1230 may provide a function for communication between the electronic system 1000 and an external host. When receiving a control command from an external host through the host interface 1230, the processor 1210 may control the integrated circuit device 1100 in response to the control command.

Figure 15:
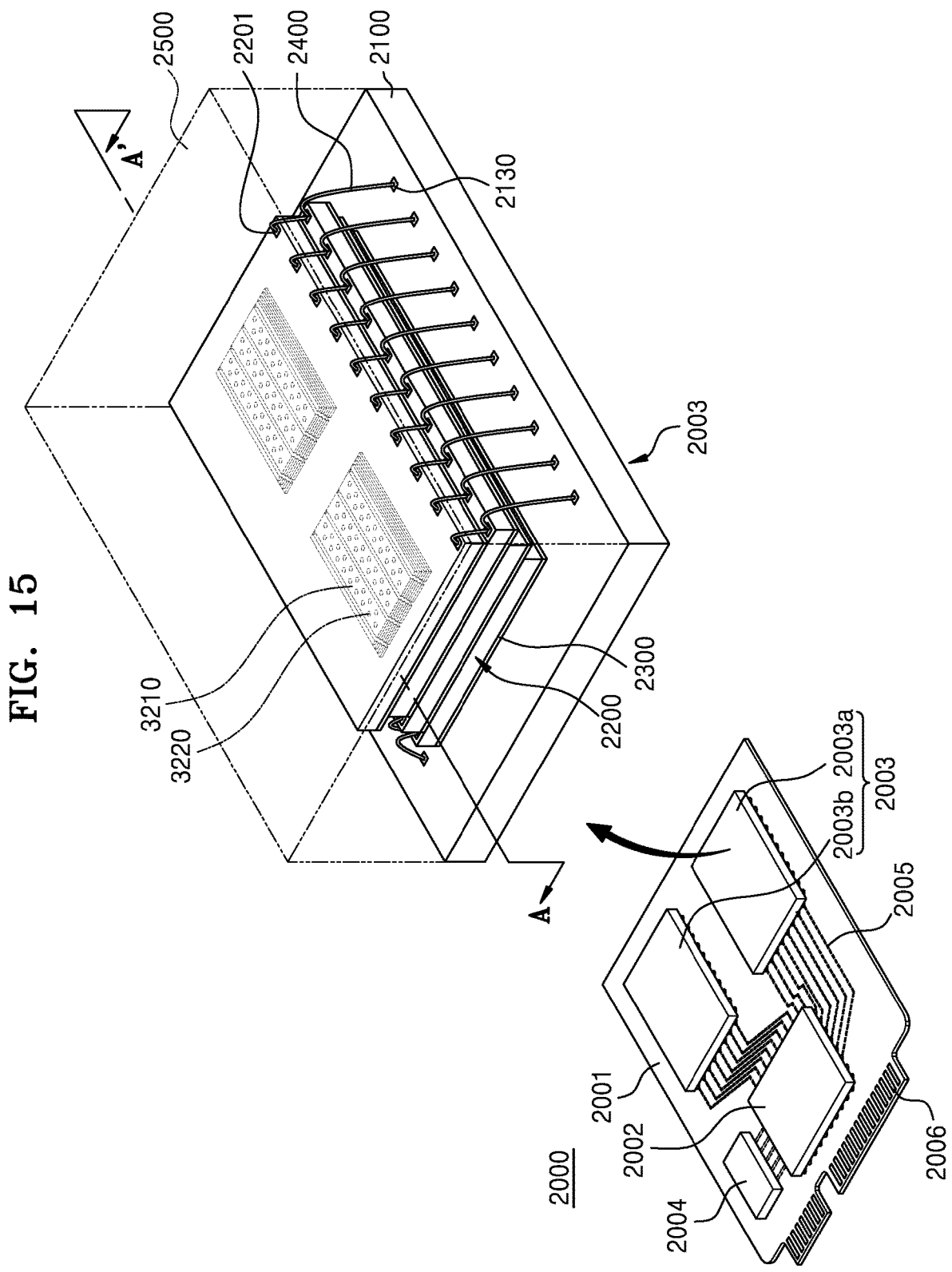
FIG. 15 is a perspective view of an electronic system including an integrated circuit device, according to some embodiments.

FIG. 15 is a perspective view of an electronic system including an integrated circuit device, according to some embodiments.

Referring to FIG. 15, an electronic system 2000 according to some embodiments may include a main board 2001, a controller 2002 mounted on the main board 2001, at least one semiconductor package 2003, and dynamic random access memory (DRAM) 2004.

The main board 2001 may include a connector 2006, which includes a plurality of pins coupled to an external host. The number and placement of pins in the connector 2006 may vary with a communication interface between the electronic system 2000 and the external host. In some embodiments, the electronic system 2000 may communicate with an external host according to any one of interfaces, such as USB, peripheral component interconnect express (PCI-Express), serial advanced technology attachment (SATA), and M-PHY for universal flash storage (UFS). In some embodiments, the electronic system 2000 may be driven by electric power supplied from an external host through the connector 2006. The electronic system 2000 may further include a power management integrated circuit (PMIC), which distributes electric power supplied from the external host to the controller 2002 and the semiconductor package 2003. The semiconductor package 2003 and the DRAM 2004 may be connected to the controller 2002 by a plurality of wiring patterns 2005 formed on the main board 2001.

The controller 2002 may write data to or read data from the semiconductor package 2003 and may increase the operating speed of the electronic system 2000.

The DRAM 2004 may function as a buffer memory for mitigating the speed difference between an external host and the semiconductor package 2003 that is a data storage space. The DRAM 2004 included in the electronic system 2000 may also operate as a sort of cache memory and provide a space for temporarily storing data in a control operation on the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b separated from each other. Each of the first and second semiconductor packages 2003a and 2003b may include a plurality of semiconductor chips 2200. Each of the first and second semiconductor packages 2003a and 2003b may include a package substrate 2100, the semiconductor chips 2200 on the package substrate 2100, an adhesive layer 2300 on the bottom surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may include a printed circuit board (PCB) including a plurality of package upper pads 2130. Each of the semiconductor chips 2200 may include an I/O pad 2201. The I/O pad 2201 may be an I/O pad 1101 in FIG. 14. Each of the semiconductor chips 2200 may include a plurality of gate stacks 3210 and a plurality of channel structures 3220. The semiconductor chips 2200 may include at least one of the integrated circuit devices 100, 200, 300, and 400 described with reference to FIGS. 3 to 9.

In some embodiments, the connection structure 2400 may include a bonding wire, which electrically connects the I/O pad 2201 to a package upper pad 2130. Accordingly, in the first and second semiconductor packages 2003a and 2003b, the semiconductor chips 2200 may be electrically connected to each other by a bonding wire and electrically connected to the package upper pads 2130 of the package substrate 2100. In some embodiments, in the first and second semiconductor packages 2003a and 2003b, the semiconductor chips 2200 may be electrically connected to each other by a connection structure, which includes a TSV, instead of the connection structure 2400 using a bonding wire.

In some embodiments, the controller 2002 and the semiconductor chips 2200 may be included in a single package.

In some embodiments, the controller 2002 and the semiconductor chips 2200 may be mounted on an interposer board separate from the main board 2001 and may be connected to each other by wiring formed on the interposer board.

Figure 16:
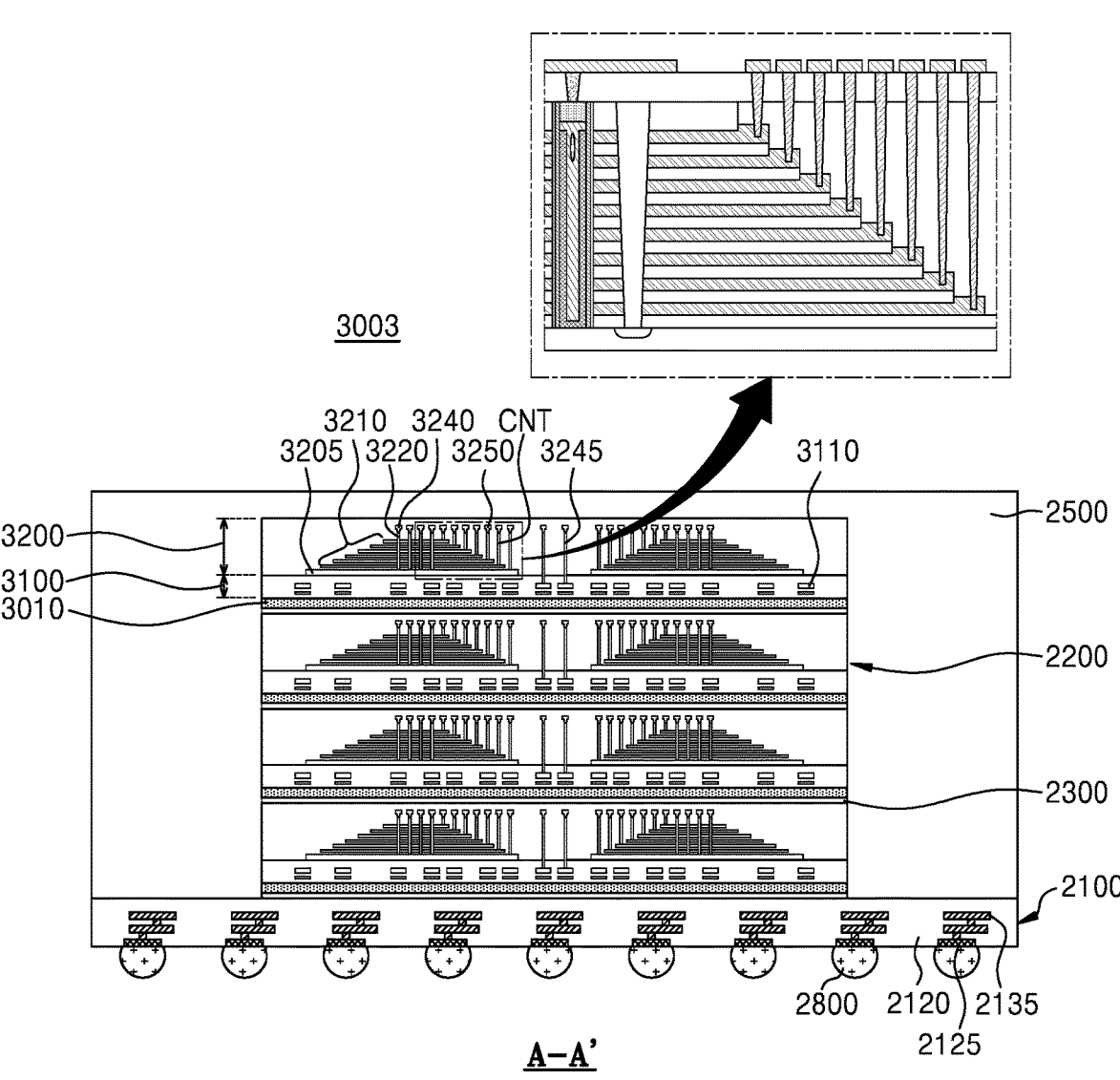
FIGS. 16 and 17 are cross-sectional views of semiconductor packages including an integrated circuit device, according to some embodiments.
Figure 17:
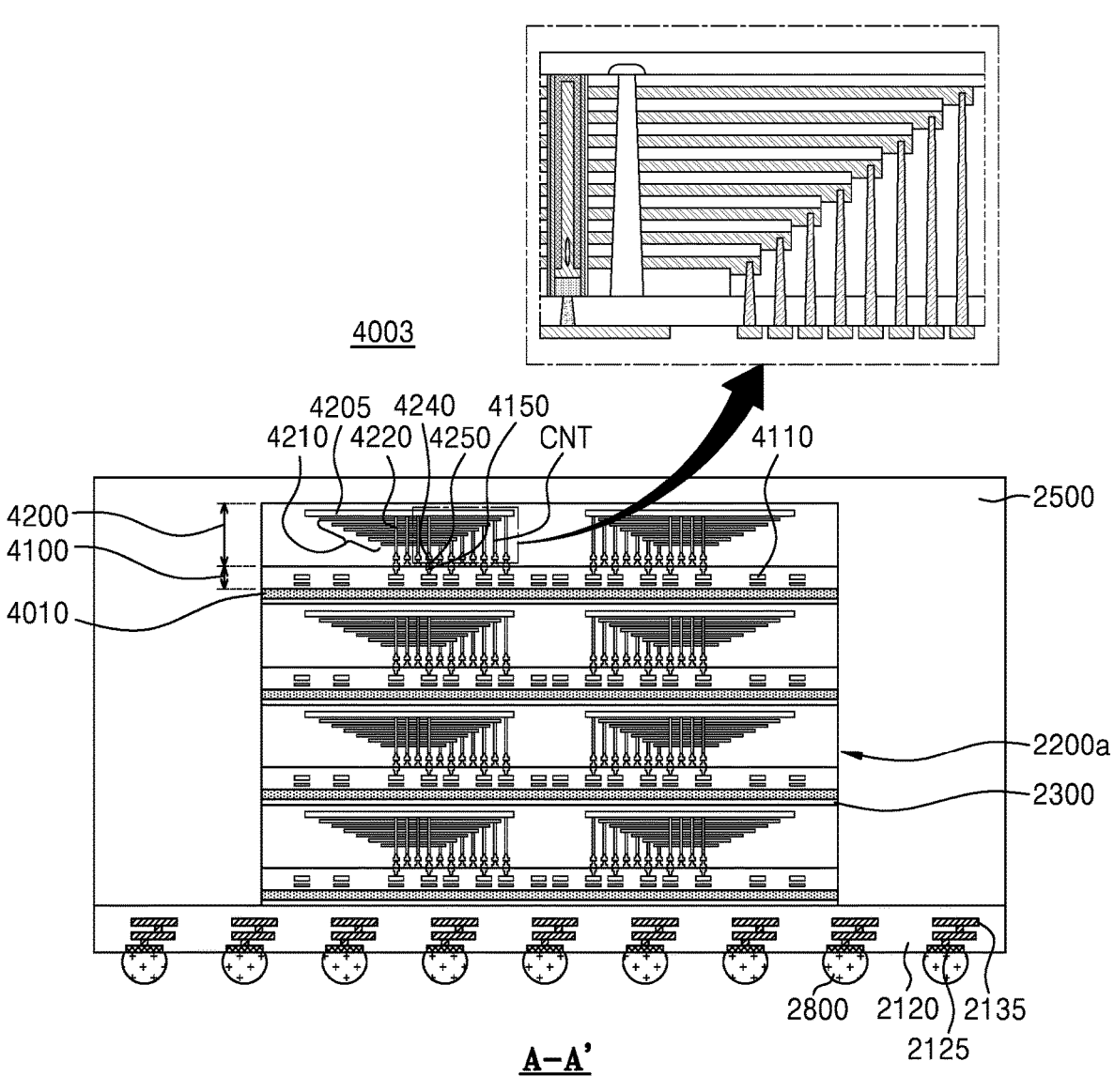

FIGS. 16 and 17 are cross-sectional views of semiconductor packages including an integrated circuit device, according to embodiments.

In detail, FIGS. 16 and 17 show in detail the configurations of a cross-section taken along line A-A' in FIG. 15.

Referring to FIG. 16, in the semiconductor package 3003, the package substrate 2100 may be a PCB.

The package substrate 2100 may include a body 2120, a plurality of upper pads (2130 in FIG. 15) on the top surface of the body 2120, a plurality of lower pads 2125 arranged on or exposed by the bottom surface of the body 2120, and a plurality of internal wirings 2135, which are inside the body 2120 and electrically connect the package upper pads 2130 to the lower pads 2125. The upper pads 2130 may be electrically connected to a plurality of connection structures 2400 (in FIG. 15). The lower pads 2125 may be respectively connected to the wiring patterns 2005 on the main board 2001 of the electronic system 2000 of FIG. 15 through a plurality of conductive connectors 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wirings 3110. The first structure 3100 may include the peripheral transistors 60TR, as described above with reference to FIG. 8. Although it is illustrated in FIG. 16 that the first structure 3100 has a similar structure as the peripheral circuit region of the integrated circuit device 200 of FIG. 8, the inventive concept is not limited thereto.

The second structure 3200 may include a common source line 3205, a gate stack 3210 on the common source line 3205, a channel structure 3220 passing through the gate stack 3210, and a bit line 3240 electrically connected to the channel structure 3220. The gate stack 3210 may include the conductive lines 130 illustrated in FIG. 8. Each of the semiconductor chips 2200 may include a plurality of contact plugs CNT electrically connected to the conductive lines 130, respectively.

Each of the semiconductor chips 2200 may include a through wiring 3245, which is electrically connected to the peripheral wirings 3110 of the first structure 3100 and extends into the second structure 3200. The through wiring 3245 may be outside the gate stack 3210. In some embodiments, the semiconductor package 3003 may further include a through wiring passing through the gate stack 3210. Each of the semiconductor chips 2200 may further include an I/O pad (2201 in FIG. 15), which is electrically connected to the peripheral wirings 3110 of the first structure 3100.

Referring to FIG. 17, a semiconductor package 4003 may have a similar structure to the semiconductor package 3003 described with reference to FIG. 16. However, the semiconductor package 4003 may include a plurality of semiconductor chips 2200a.

Each of the semiconductor chips 2200a may include a semiconductor substrate 4010, a first structure 4100 on the semiconductor substrate 4010, and a second structure 4200 which is on the first structure 4100 and is bonded to the first structure 4100 by a wafer bonding manner.

The first structure 4100 may include a peripheral circuit region, which includes a peripheral wiring 4110 and a plurality of first bonding structures 4150. The first structure 4100 may include the peripheral transistors 60TR, as described above with reference to FIG. 8. Although it is illustrated in FIG. 17 that the first structure 4100 has a similar structure as the peripheral circuit region of the integrated circuit device 200 of FIG. 8, the inventive concept is not limited thereto.

The second structure 4200 may include a common source line 4205, a gate stack 4210 between the common source line 4205 and the first structure 4100, and a channel structure 4220 passing through the gate stack 4210. The gate stack 4210 may include the conductive lines 130 illustrated in FIG. 8. Each of the semiconductor chips 2200a may include a plurality of contact plugs CNT electrically connected to the conductive lines 130, respectively.

Each of the semiconductor chips 2200a may include a plurality of second bonding structures 4250, which are respectively electrically connected to the conductive lines 130. For example, some of the second bonding structures 4250 may be configured to be respectively connected to bit lines 4240, which are respectively electrically connected to the channel structures 4220. The others of the second bonding structures 4250 may be configured to be respectively electrically connected to the conductive lines 130 through the contact plugs CNT.

The first bonding structures 4150 of the first structure 4100 may be respectively bonded to and in contact with the second bonding structures 4250 of the second structure 4200. For example, the respective bonded portions of the first bonding structures 4150 and the second bonding structures 4250 may include metal, e.g., Cu, but are not limited thereto.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

As used herein, an element or region that is "covering" or "surrounding" or "filling" another element or region may completely or partially cover or surround or fill the other element or region.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the scope of the present inventive concept.

While the inventive concept has been particularly shown and described with reference to some example embodiments thereof, it will be understood that various changes in form and details may be made therein without departing from the spirit and scope of the following claims.

What is claimed is:

1. An integrated circuit device comprising:
   a plurality of conductive lines extending on a semiconductor substrate in a horizontal direction and overlapping each other in a vertical direction;

a plurality of insulating layers alternating with the plurality of conductive lines and extending in the horizontal direction; and a channel structure extending through the plurality of conductive lines and the plurality of insulating layers, wherein the channel structure includes:

a core insulating layer;

a resistance change layer on a side wall and a bottom surface of the core insulating layer;

a channel layer on an outside wall of the resistance change layer; and a pad pattern on a top surface of the core insulating layer, wherein a topmost surface of the resistance change layer is in contact with the core insulating layer and is spaced apart from a bottommost surface of the pad pattern.

2. The integrated circuit device of claim 1, wherein the core insulating layer includes a first portion including a portion of the side wall contacting the resistance change layer and a second portion including a portion of the side wall contacting the channel layer, and wherein a first horizontal width of the first portion of the core insulating layer is narrower than a second horizontal width of the second portion of the core insulating layer.

3. The integrated circuit device of claim 2, wherein the first portion of the core insulating layer includes a cavity, a topmost surface of the second portion of the core insulating layer is in contact with the bottommost surface of the pad pattern, and the cavity is spaced apart from the bottommost surface of the pad pattern in the vertical direction.

4. The integrated circuit device of claim 3, wherein the topmost surface of the resistance change layer has a curved shape, the topmost surface of the second portion of the core insulating layer has a round shape, and the pad pattern extends along the topmost surface of the second portion of the core insulating layer.

5. The integrated circuit device of claim 1, wherein a vertical level of a topmost surface of the channel layer is equal to a vertical level of a topmost surface of the pad pattern from the semiconductor substrate.

6. The integrated circuit device of claim 1, wherein the pad pattern has a step between a topmost surface of the channel layer and a topmost surface of the core insulating layer.

7. The integrated circuit device of claim 6, wherein the core insulating layer includes a first portion including a portion of the side wall contacting the resistance change layer and a second portion including a portion of the side wall contacting the channel layer, a first horizontal width of the first portion of the core insulating layer is narrower than a second horizontal width of the second portion of the core insulating layer, and the second horizontal width of the core insulating layer is narrower than a third horizontal width that is a widest horizontal width of the pad pattern.

8. The integrated circuit device of claim 6, wherein the pad pattern includes a side wall portion on the channel layer and a central portion on the core insulating layer, and a first thickness of the side wall portion in the vertical direction is thinner than a second thickness of the central portion in the vertical direction.

9. The integrated circuit device of claim 8, wherein a side wall of the central portion of the pad pattern is in contact with an inside wall of the channel layer, and a side wall of the side wall portion of the pad pattern is coplanar with an outside wall of the channel layer.

10. The integrated circuit device of claim 1, wherein the core insulating layer includes a first portion having a first horizontal width and a second portion that separates the pad pattern from the first portion and has a second horizontal width wider than the first horizontal width, and the first portion of the core insulating layer comprises a cavity.

11. An integrated circuit device comprising:

a semiconductor substrate including a cell region and a connection region adjacent to the cell region;

a gate stack extending in a first direction and a second direction, including a plurality of conductive lines and a plurality of insulating layers, and having a stepped structure in the connection region, the first and second directions being parallel to a main surface of the semiconductor substrate and crossing each other, the plurality of conductive lines and the plurality of insulating layers being alternately stacked in a third direction that is perpendicular to the main surface of the semiconductor substrate;

a channel structure in the cell region and extending through the gate stack in the third direction; and a plurality of contact plugs in the connection region and in contact with respective end portions of the plurality of conductive lines, wherein the channel structure includes a core insulating layer, a resistance change layer on a side wall and a bottom surface of the core insulating layer, a channel layer on an outside wall of the resistance change layer, a dielectric layer on an outside wall of the channel layer, and a pad pattern on a top surface of the core insulating layer, and a topmost surface of the resistance change layer is in contact with the core insulating layer and is spaced apart from a bottommost surface of the pad pattern.

12. The integrated circuit device of claim 11, wherein a first portion of the core insulating layer includes a cavity, and a side wall of the first portion of the core insulating layer is in contact with the resistance change layer, a topmost surface of a second portion of the core insulating layer is in contact with the bottommost surface of the pad pattern, and a sidewall of the second portion of the core insulating layer is in contact with the channel layer, and the cavity is spaced apart from the bottommost surface of the pad pattern in the third direction.

13. The integrated circuit device of claim 12, wherein a first horizontal width of the first portion of the core insulating layer is narrower than a second horizontal width of the second portion of the core insulating layer, and the topmost surface of the resistance change layer has a curved shape, the topmost surface of the second portion of the core insulating layer has a round shape, and the pad pattern extends along the topmost surface of the second portion of the core insulating layer.

14. The integrated circuit device of claim 12, wherein an inside wall of the channel layer is in contact with the outside wall of the resistance change layer, the side wall of the second portion of the core insulating layer, and a side wall of the pad pattern, and the outside wall of the channel layer is in contact with an inside wall of the dielectric layer.

15. The integrated circuit device of claim 11, wherein the pad pattern has a step between a topmost surface of the channel layer and a topmost surface of the core insulating layer, the core insulating layer includes a first portion including a portion of the side wall contacting the resistance change layer and a second portion including a portion of the side wall contacting the channel layer, a first horizontal width of the first portion of the core insulating layer is narrower than a second horizontal width of the second portion of the core insulating layer, and the second horizontal width of the core insulating layer is narrower than a third horizontal width that is a widest horizontal width of the pad pattern.

16. The integrated circuit device of claim 15, wherein a side wall of the pad pattern is coplanar with the outside wall of the channel layer, and the side wall of the pad pattern and the outside wall of the channel layer are in contact with an inside wall of the dielectric layer.

17. The integrated circuit device of claim 11, wherein a vertical level of a topmost surface of the pad pattern is equal to a vertical level of a topmost surface of the dielectric layer from the semiconductor substrate, a vertical level of the bottommost surface of the pad pattern is lower than a vertical level of a topmost surface of the channel layer from the semiconductor substrate, and the vertical level of the bottommost surface of the pad pattern is higher than a vertical level of the topmost surface of the resistance change layer from the semiconductor substrate.

18. The integrated circuit device of claim 11, wherein the core insulating layer includes silicon nitride, the channel layer and the pad pattern include doped polysilicon, and the resistance change layer includes a variable resistive material.

19. An electronic system comprising:

a main board;

an integrated circuit device on the main board; and a controller on the main board and electrically connected to the integrated circuit device, wherein the integrated circuit device includes:

a plurality of conductive lines extending on a semiconductor substrate in a horizontal direction and overlapping each other in a vertical direction;

a plurality of insulating layers alternating with the plurality of conductive lines and extending in the horizontal direction; and a channel structure extending through the plurality of conductive lines and the plurality of insulating layers, wherein the channel structure includes a core insulating layer, a resistance change layer on a side wall and a bottom surface of the core insulating layer, a channel layer on an outside wall of the resistance change layer, and a pad pattern on a top surface of the core insulating layer, and a topmost surface of the resistance change layer is in contact with the core insulating layer and is spaced apart from a bottommost surface of the pad pattern.

20. The electronic system of claim 19, wherein the main board includes wiring patterns electrically connecting the integrated circuit device to the controller, a first portion of the core insulating layer includes a cavity, and a side wall of the first portion of the core insulating layer is in contact with the resistance change layer, a topmost surface of a second portion of the core insulating layer is in contact with the bottommost surface of the pad pattern, and a side wall of the second portion of the core insulating layer is in contact with the channel layer, and the cavity is spaced apart from the bottommost surface of the pad pattern in the vertical direction.

* * * * *